US010327351B2

(12) United States Patent
McGraw et al.

(10) Patent No.: US 10,327,351 B2
(45) Date of Patent: Jun. 18, 2019

(54) SLED, TRAY, AND SHELF ASSEMBLY FOR COMPUTER DATA CENTER

(71) Applicant: MacStadium, Inc., Atlanta, GA (US)

(72) Inventors: Gregory P. McGraw, Marietta, GA (US); Michael A. Landreth, Roswell, GA (US)

(73) Assignee: MACSTADIUM, INC., Atlanta, GA (US)

( * ) Notice: Subject to any disclaimer, the term of this patent is extended or adjusted under 35 U.S.C. 154(b) by 0 days.

(21) Appl. No.: 15/794,659

(22) Filed: Oct. 26, 2017

(65) Prior Publication Data

US 2018/0116069 A1     Apr. 26, 2018

Related U.S. Application Data

(60) Provisional application No. 62/412,899, filed on Oct. 26, 2016.

(51) Int. Cl.
*H05K 7/14* (2006.01)
*H05K 7/20* (2006.01)

(52) U.S. Cl.
CPC ....... *H05K 7/1489* (2013.01); *H05K 7/20709* (2013.01)

(58) Field of Classification Search
CPC .... H05K 7/1489; H05K 7/20709; H05K 7/14; H05K 7/20
See application file for complete search history.

(56) References Cited

U.S. PATENT DOCUMENTS

| | | |
|---|---|---|
| 3,767,059 A | 10/1973 | Seiz |
| 3,798,507 A | 3/1974 | Damon et al. |
| 4,019,099 A | 4/1977 | Calabro |
| 4,327,835 A | 5/1982 | Leger |
| 4,335,819 A | 6/1982 | Weisman et al. |
| 4,407,416 A | 10/1983 | Anderson |
| 4,476,986 A | 10/1984 | Robinson |
| 4,501,368 A | 2/1985 | Gill |
| 4,519,016 A | 5/1985 | Bradley et al. |
| 4,758,928 A | 7/1988 | Wierec et al. |
| 4,802,593 A | 2/1989 | Romanos |
| 4,866,576 A | 9/1989 | Umetsu et al. |
| 4,955,490 A | 9/1990 | Schafer |

(Continued)

*Primary Examiner* — Stanton L Krycinski
(74) *Attorney, Agent, or Firm* — Morris, Manning & Martin, LLP; John R. Harris; R. Lee Strasburger, Jr.

(57) ABSTRACT

An arrangement for mounting and supporting a plurality of cylindrical form or other computer systems, for example Apple Mac Pro cylindrical form computer systems, in a data center so as to optimize cooling air flow, access to cabling, and maximized use of space. A plurality of shelf assemblies is mounted to a computer center rack. Each shelf assembly comprises a tray that supports a pair of slidable sleds. Each sled supports a cylindrical form computer enclosure in an axially horizontal configuration, and includes a sled face that exposes a top surface of a computer enclosure. Air flow perforations in the sled face direct air into the space behind the sled face and across a mounted computer enclosure. The tray and sled provides a convenient arrangement for power and communications cabling, as well as directs a cooling air flow through openings in the trays and sleds upwardly across computer enclosures.

5 Claims, 29 Drawing Sheets

(56) References Cited

U.S. PATENT DOCUMENTS

| | | |
|---|---|---|
| 4,995,682 A | 2/1991 | Gutner |
| 5,027,254 A | 6/1991 | Corfits et al. |
| 5,044,506 A | 9/1991 | Brown |
| 5,124,886 A | 6/1992 | Golobay |
| 5,297,684 A | 3/1994 | Meunier et al. |
| D346,370 S | 4/1994 | Hetfield et al. |
| 5,394,305 A | 2/1995 | Moral et al. |
| 5,398,822 A | 3/1995 | McCarthy et al. |
| 5,590,794 A | 1/1997 | Zachary |
| 5,757,617 A | 5/1998 | Sherry |
| 5,823,332 A | 10/1998 | Clausen |
| 5,890,606 A | 4/1999 | Kuipers |
| 5,892,662 A | 4/1999 | Verma |
| 5,912,799 A | 6/1999 | Grouell |
| 6,008,621 A | 12/1999 | Madison et al. |
| 6,075,694 A | 6/2000 | Mills et al. |
| 6,088,222 A | 7/2000 | Schmitt et al. |
| 6,256,205 B1 | 7/2001 | Perry et al. |
| 6,388,875 B1 | 5/2002 | Chen |
| 6,469,899 B2 * | 10/2002 | Hastings .............. H05K 7/1489 248/65 |
| 6,480,391 B1 | 11/2002 | Monson et al. |
| 6,482,541 B1 | 11/2002 | Bator et al. |
| 6,621,711 B1 | 9/2003 | Haworth et al. |
| 6,644,481 B2 * | 11/2003 | Dean .................. H05K 7/1489 211/190 |
| 6,719,149 B2 * | 4/2004 | Tomino ................ G02B 6/4453 211/26 |
| 6,719,150 B2 | 4/2004 | Marraffa |
| 7,055,701 B2 * | 6/2006 | Dean .................. H05K 7/1489 211/190 |
| 7,055,704 B2 | 6/2006 | Alter |
| 7,075,796 B1 | 7/2006 | Pritchett |
| 7,134,558 B1 * | 11/2006 | Mimlitch, III ....... A47B 47/024 211/26 |
| D582,918 S | 12/2008 | Scott |
| D586,583 S * | 2/2009 | Schluter ...................... D6/675 |
| 7,548,429 B2 | 6/2009 | Miller |
| D598,024 S | 8/2009 | Scott et al. |
| 7,595,995 B2 | 9/2009 | Hock |
| 7,806,277 B2 * | 10/2010 | Mimlitch, III ....... A47B 96/025 211/26 |
| 7,866,488 B2 * | 1/2011 | Mimlitch, III ....... H05K 7/1489 211/26 |
| 7,909,180 B2 | 3/2011 | Barringer et al. |
| 8,070,242 B2 | 12/2011 | Makabe |
| 8,079,481 B2 | 12/2011 | Canfield et al. |
| 8,238,082 B2 | 8/2012 | Salpeter |
| 8,376,157 B2 | 2/2013 | Jarvis et al. |
| 8,443,992 B2 | 5/2013 | Lawson et al. |
| D685,373 S | 7/2013 | Santos et al. |
| 8,490,800 B2 | 7/2013 | Colin |
| 8,559,176 B2 * | 10/2013 | Arflack ................ H05K 7/1489 361/690 |
| D694,240 S | 11/2013 | Cho |
| 8,684,191 B2 | 4/2014 | Hosey et al. |
| 8,752,848 B2 | 6/2014 | Petrick et al. |
| D714,789 S | 10/2014 | Chen et al. |
| D720,353 S | 12/2014 | Nakamura |
| D735,726 S | 8/2015 | Chen |
| D743,402 S | 11/2015 | Ehara et al. |
| D743,403 S | 11/2015 | Ehara et al. |
| 9,237,671 B2 * | 1/2016 | Chen ................... H05K 7/1489 |
| D755,182 S | 5/2016 | Bassett et al. |
| 9,370,121 B2 * | 6/2016 | Chen ................... H05K 7/1491 |
| 9,411,525 B2 | 8/2016 | Frink et al. |
| 9,648,771 B1 * | 5/2017 | Markowski .......... H05K 7/1425 |
| 9,781,858 B2 * | 10/2017 | Fricker ................. H05K 7/18 |
| 9,807,903 B2 * | 10/2017 | Kuan ................... H05K 7/1489 |
| 9,872,413 B2 * | 1/2018 | Lin ....................... G11B 33/124 |
| 9,930,804 B2 * | 3/2018 | Lu ........................ H05K 7/1488 |
| 9,933,823 B2 * | 4/2018 | Chen ................... G06F 1/187 |
| 9,986,830 B2 * | 6/2018 | Chen ................... A47B 88/423 |
| 10,039,204 B2 * | 7/2018 | Kyle .................... H05K 7/1421 |
| 10,051,758 B2 * | 8/2018 | Hofmann ............. H05K 7/1489 |
| 2002/0006026 A1 | 1/2002 | Takahashi et al. |
| 2003/0193781 A1 * | 10/2003 | Mori ................... H05K 7/1489 361/725 |
| 2004/0040922 A1 | 3/2004 | Ko |
| 2004/0057216 A1 | 3/2004 | Smith et al. |
| 2004/0155003 A1 | 8/2004 | Anderson et al. |
| 2004/0195195 A1 | 10/2004 | Mason |
| 2005/0146855 A1 | 7/2005 | Brehm et al. |
| 2006/0131252 A1 | 6/2006 | Tobias |
| 2006/0261025 A1 | 11/2006 | Heyderman et al. |
| 2008/0244052 A1 | 10/2008 | Bradicich et al. |
| 2009/0231806 A1 * | 9/2009 | Lee ..................... G06F 1/181 361/679.58 |
| 2012/0020006 A1 * | 1/2012 | Xu ....................... G06F 1/186 361/679.33 |
| 2012/0325763 A1 | 12/2012 | Loy et al. |
| 2013/0048581 A1 * | 2/2013 | Kuo ..................... H05K 7/1489 211/26 |
| 2013/0164586 A1 | 6/2013 | Uchida |
| 2013/0175993 A1 | 7/2013 | Chen |
| 2014/0021154 A1 * | 1/2014 | Chen ................... H05K 7/1489 211/86.01 |
| 2014/0055934 A1 * | 2/2014 | Wu ..................... H05K 7/1489 361/679.02 |
| 2014/0091696 A1 | 4/2014 | Welker et al. |
| 2014/0175031 A1 | 6/2014 | Roberts |
| 2015/0129514 A1 | 5/2015 | Bourdoncle et al. |
| 2016/0113421 A1 | 4/2016 | Muzyka et al. |
| 2016/0316585 A1 * | 10/2016 | Lu ....................... H05K 7/1489 |

\* cited by examiner

SLED, TRAY, AND SHELF ASSEMBLY FOR COMPUTER DATA CENTER

CROSS-REFERENCE TO RELATED APPLICATION

This application claims benefit under 35 U.S.C. § 119(e) of U.S. Provisional Patent Application No. 62/412,899, filed Oct. 26, 2016, entitled "SLED, TRAY, AND SHELF ASSEMBLY FOR COMPUTER DATA CENTER", which is incorporated herein by reference as set forth herein in its entirety.

TECHNICAL FIELD

The present disclosure relates generally to the field of storing and organizing large scale computer systems.

BACKGROUND

Computer data centers are facilities that contain racks or shelves of computer systems and their associated components such as power supplies and telecommunications systems. Large data centers house hundreds, often thousands, of separate computers, which are connected for communications with computers in the data center and with telecommunication networks such as the Internet, thereby forming the essential infrastructure of "cloud computing." The racks of computers often extend from floor to ceiling, mounted atop hollow flooring structures called plenums that route cooling air to the various racks, with heat removal vents positioned above the racks. A facility housing thousands of computers uses many kilowatts of electricity and generates large amounts of heat that must be removed so that the computers can operate within their specified ranges of operating temperatures.

Space, cooling, power cabling, and communications cabling requirements are therefore critical for modern data centers. Floor space in terms of square feet footprint per rack and height requirements for each rack of computers are limited, so as to provide required cooling air and power requirements, as well as security within physical cages and accessibility for configuration and maintenance.

One particular type of computer that is popular for certain computing applications is the APPLE® Mac Pro, manufactured by Apple, Inc., Cupertino, Calif. The Mac Pro is considered a workstation or server computer but does not include a display, keyboard, or mouse. Although the Mac Pro computer is not typically considered to be a data center type computer device, it possesses certain features that make it desirable for deployment in data centers.

For example, the Mac Pro computer's processor and associated internal peripheral circuitry make it highly suitable for hosting development environments for the APPLE® computing infrastructure and environment, which is built around the OS X operating system (and expected successors to OS X) for enterprise and personal computing, and the iOS operating system for mobile devices from Apple, Inc., such as the iPhone and iPad. Other conventional types of computer systems, because they lack the unique circuitry and components of the Apple computing environment, are not readily capable of running OS X or certain iOS development platforms. Thus, the Mac Pro computer is highly capable of serving data center needs for conventional data center computing requirements, as well as specialized service to the OS X and iOS development communities.

In contrast, however, the cylindrical form of the Mac Pro computer is not readily suitable for deployment in data centers that typically house a number of standard computer housings or enclosures called a "rack unit". A typical rack unit is 19 inches wide by 1.75 inches high (with sometimes varying depths), which is considered a "1 U". The Mac Pro computer is manufactured in a cylindrical form that is configured to be oriented in an upright position, which minimizes the footprint of the Mac Pro computer on a desk. The cylindrical Mac Pro computer is not a standard "U" type enclosure or housing and thus presents certain mounting configuration challenges.

Further, the Mac Pro computer is manufactured with one internal thermal core at its center and a single fan positioned at its top end (when oriented upright) that draws air up through the bottom end of the Mac Pro computer, past the thermal core, and out the top of the Mac Pro computer. Finally, the Mac Pro computer is manufactured with one panel containing controls and communication and power ports for the Mac Pro computer, which extends axially along an arc on the circumference of the cylindrical form.

As a result of increasing demand by the OS X and iOS developers' community, there is a need for a data center that can efficiently house computer systems that can provide OS X-compatible hosting environments, as well as other cloud-based computing requirements. The present disclosure relates to a highly space and thermal-efficient data center computer rack mounting arrangement that provides for maximized usage of computer enclosures that are not standard "U" type configurations, such as Mac Pro computers.

Examples of computer center data racks that house Mac Pro and Mac mini computers are shown in U.S. Pat. Nos. 9,756,765 and 9,763,354 and D761,246 and D762,217, which are owned by the same assignee as the present application. The present disclosure provides certain novel and nonobvious improvements and enhancements to the computer center data racks disclosed in these patents.

BRIEF SUMMARY OF THE DISCLOSURE

Briefly described, and according to one embodiment, aspects of the present disclosure generally relate to a small form factor self-contained computer mounting arrangement that allows horizontally mounting Mac Pro computers in individual cylindrical form enclosures. Each Mac Pro computer is mounted in a single cylindrical form enclosure, with a plurality of such enclosures on a shelf, with a plurality of shelves on a rack. The combination of enclosures on a shelf and multiple stacked shelves form a rack.

Briefly described, and according to another embodiment, aspects of the present disclosure generally relate to a small form factor self-contained computer mounting arrangement that allows horizontally mounting Mac Pro computers on a sled and tray style assembly. Each Mac Pro computer rests on a sled and each tray contains two sleds. The combination of sleds on a tray form a shelf assembly, and multiple stacked shelf assemblies form a rack. The sled design allows for a single computer to be pulled in an outward position for enhanced accessibility and convenient arrangements for power and communications cabling.

These and other aspects, features, and benefits of the claimed invention(s) will become apparent from the following detailed written description of the preferred embodiments and aspects taken in conjunction with the following drawings, although variations and modifications thereto may be effected without departing from the spirit and scope of the novel concepts of the disclosure.

BRIEF DESCRIPTION OF THE DRAWINGS

The accompanying drawings illustrate one or more embodiments and/or aspects of the disclosure and, together with the written description, serve to explain the principles of the disclosure. Wherever possible, the same reference numbers are used throughout the drawings to refer to the same or like elements of an embodiment, and wherein.

DETAILED DESCRIPTION

Figure 1:
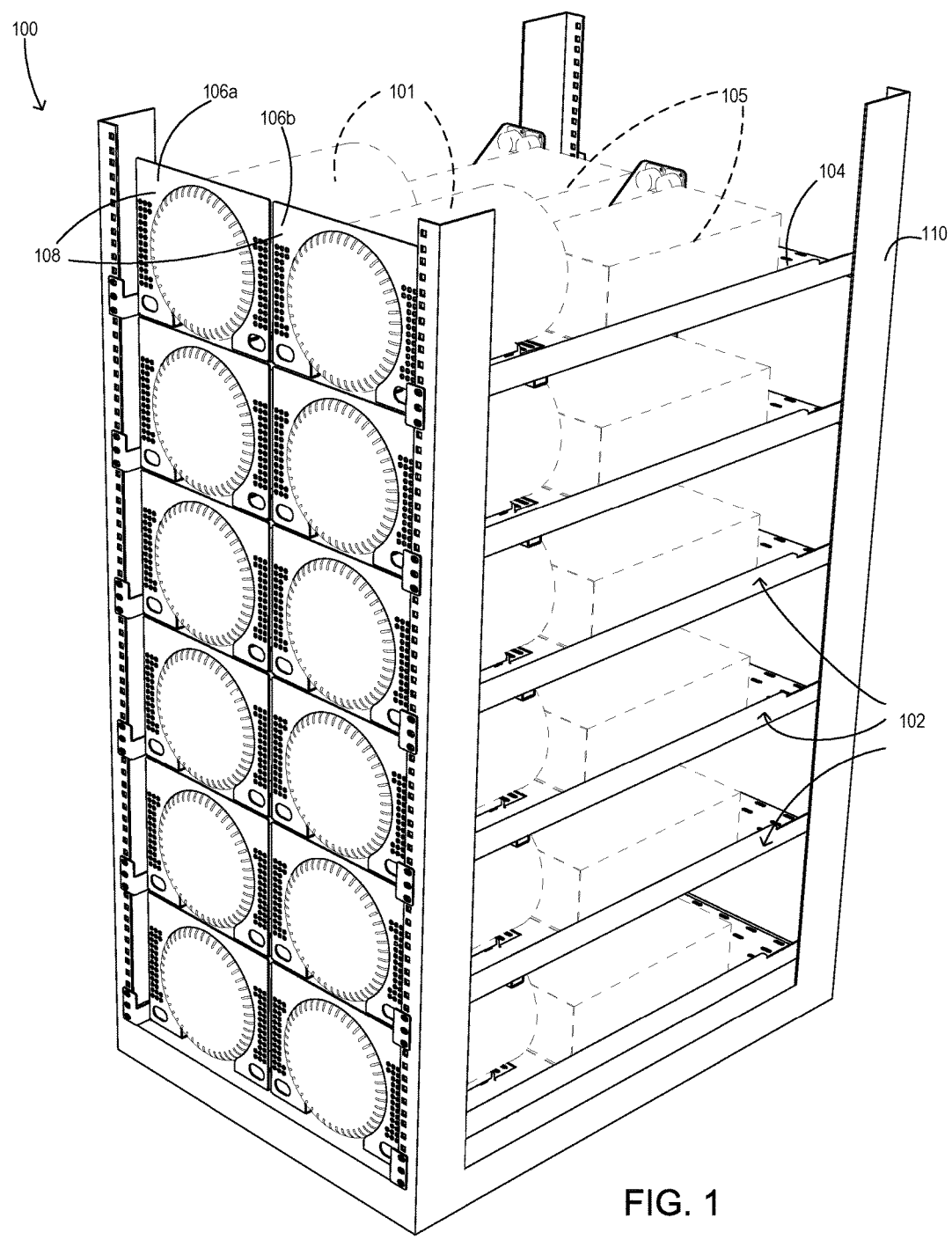
FIG. 1 illustrates a perspective view of a data center mounting rack, according to an aspect of the present disclosure.

For the purpose of promoting an understanding of the principles of the present disclosure, reference will now be made to the embodiments illustrated in the drawings and specific language will be used to describe the same. It will, nevertheless, be understood that no limitation of the scope of the disclosure is thereby intended; any alterations and further modifications of the described or illustrated embodiments, and any further applications of the principles of the disclosure as illustrated therein are contemplated as would normally occur to one skilled in the art to which the disclosure relates. All limitations of scope should be determined in accordance with and as expressed in the claims.

One aspect of the present disclosure generally relates to a cylindrical form computer mounting arrangement which allows mounting of up to 2 Mac Pro computers or similar devices on a single shelf, up to 6 shelves, for a total of up to 12 Mac Pro computers in a single rack assembly, with slide-out accessibility and convenient arrangements for power and communications cabling, as well as generally vertical cooling air flow.

These and other aspects, features, and benefits of the claimed invention(s) will become apparent from the following detailed written description of the preferred embodiments and aspects taken in conjunction with the following drawings, although variations and modifications thereto may be effected without departing from the spirit and scope of the novel concepts of the disclosure.

Now referring to the figures, FIG. 1 illustrates a data center mounting rack 100 in accordance with this disclosure, perspective view, front side, populated with 12 Mac Pro computers 101 (shown in phantom) each mounted on a shelf assembly 102, each shelf assembly comprising a horizontal tray 104 supporting a pair of slidable sleds 106a, 106b, each having a front face 108. According to one embodiment, a single data center mounting rack 100 may hold 12 Mac Pro computers 101 oriented with each axis parallel to the plane of the tray 104. In various embodiments, the data center mounting rack comprises a plurality of racks and shelf assemblies spaced equidistant from each other within a data center. As will be appreciated by one having ordinary skill in the art, the number of racks and shelf assemblies (and height of the data center mounting rack) may be modified to accommodate the requirements of the data center. For example, in one embodiment, a data center mounting rack may comprise 6-8 shelf assemblies (and therefore may hold up to 12-16 Mac Pro computers), and a collection of racks may be provided side by side.

Still referring to FIG. 1, in one embodiment, the shelf assemblies 102 may be spaced far enough apart to provide for adequate airflow between the Mac Pro computers 101 (e.g., sufficient airflow to keep the Mac Pro computers operating within their optimal temperature range). As will be appreciated by one having ordinary skill in the art, if the Mac Pro computers are not cooled adequately, then they will overheat and operate inefficiently, which, considering the one internal thermal core and single fan, may happen very easily. In one embodiment, the shelves are configured to accommodate for airflow from within the interior of the rack through the Mac Pro and out towards the exterior of the rack. In various embodiments, the shelves may be spaced far enough apart to provide adequate space for the various cables (e.g., power, network, etc.) that are necessary to operate the Mac Pro computers as servers. In one embodiment, the cables connect to the side of the Mac Pro computers, run out the back of the cylindrical form enclosures, and run in the middle space of the shelves and out the holes in the sides of the data center mounting rack.

Generally, in various embodiments, each sled 106 is large enough for a Mac Pro computer to sit, on its side, completely supported on the sled. In various embodiments, the sled 106 also houses and supports a network adapter 105 (e.g., universal fibre channel adapter, etc.) sits. In one embodiment, the universal fibre channel adapter permits the Mac Pro computer to access more power, commercially available storage area networks (e.g., SAN arrays provided by NetApps or EMC) than would be available through its proprietary on-board adapter. In various embodiments, each sled 106 is large enough to hold, in addition to a Mac Pro and a network adapter, all of the additional cables necessary to operate the Mac Pro as a server (e.g., power adapters, network cables, etc.). According to one embodiment, the sled 106 includes ports for connecting the network adapter to a network and for providing power to the network adapter and Mac Pro computer.

According to various embodiments, the sideways orientation of the Mac Pro computer (with the axis parallel to the plane of a shelf assembly 102) enables a rack of shelf assemblies to hold more Mac Pro computers within a given space considering the thermal dissipation demands of the Mac Pro computers. According to one embodiment, the arrangement is designed to minimize the impact of the inefficient use of vertical space in the Mac Pro computer and the single fan that draws airflow from the bottom of the Mac Pro computer through to the top.

Still referring to FIG. 1, in various embodiments, the front face 108 (e.g., outward facing with respect to the shelf assembly 102) of each sled 106 includes openings to promote airflow around the computer and network adapter and permit access to the controls of the network adapter and a to promote airflow around the Mac Pro computer. According to various embodiments, the back (e.g., inward facing with respect to the shelf assembly 102) of each sled 106 is completely open to promote airflow around the network adapter and Mac Pro computer.

In one embodiment, a pair of resting supports run the length of an opening on the bottom each sled 106 and extend upwardly therefrom. Generally, the resting supports provide two points of contact on which a Mac Pro computer sits. As will be appreciated by one having ordinary skill in the art, these resting supports prevent the Mac Pro computer from moving while also limiting the amount of contact with the surface of the Mac Pro computer, which are challenges unique to the cylindrical form of the Mac Pro computer. Generally, increased contact with the surface of the Mac Pro computer results in decreased temperature control because of residual heat in the metal of the enclosure and decreased airflow around the Mac Pro computer.

In particular, FIG. 1 shows a perspective view of an exemplary assembled data center mounting rack 100 including six shelf assemblies 102 with cylindrical computers 101 (shown in phantom) such a Mac Pro and port expansion chassis 105 (also shown in phantom), in a particular embodiment. In accordance with the present disclosure, each shelf assembly 102 includes at least one tray 104 and two identical slidable sleds 106 positioned side by side, e.g. 106a, 106b. At least one cylindrical form computer 101, coupled with at least one expansion chassis 105, may horizontally rest on a sled 106, and a pair of sleds 106a, 106b rests on a tray 104. Each shelf assembly 102 is mounted to a rack frame 110, to constitute a complete mounting rack 100.

Figure 2:
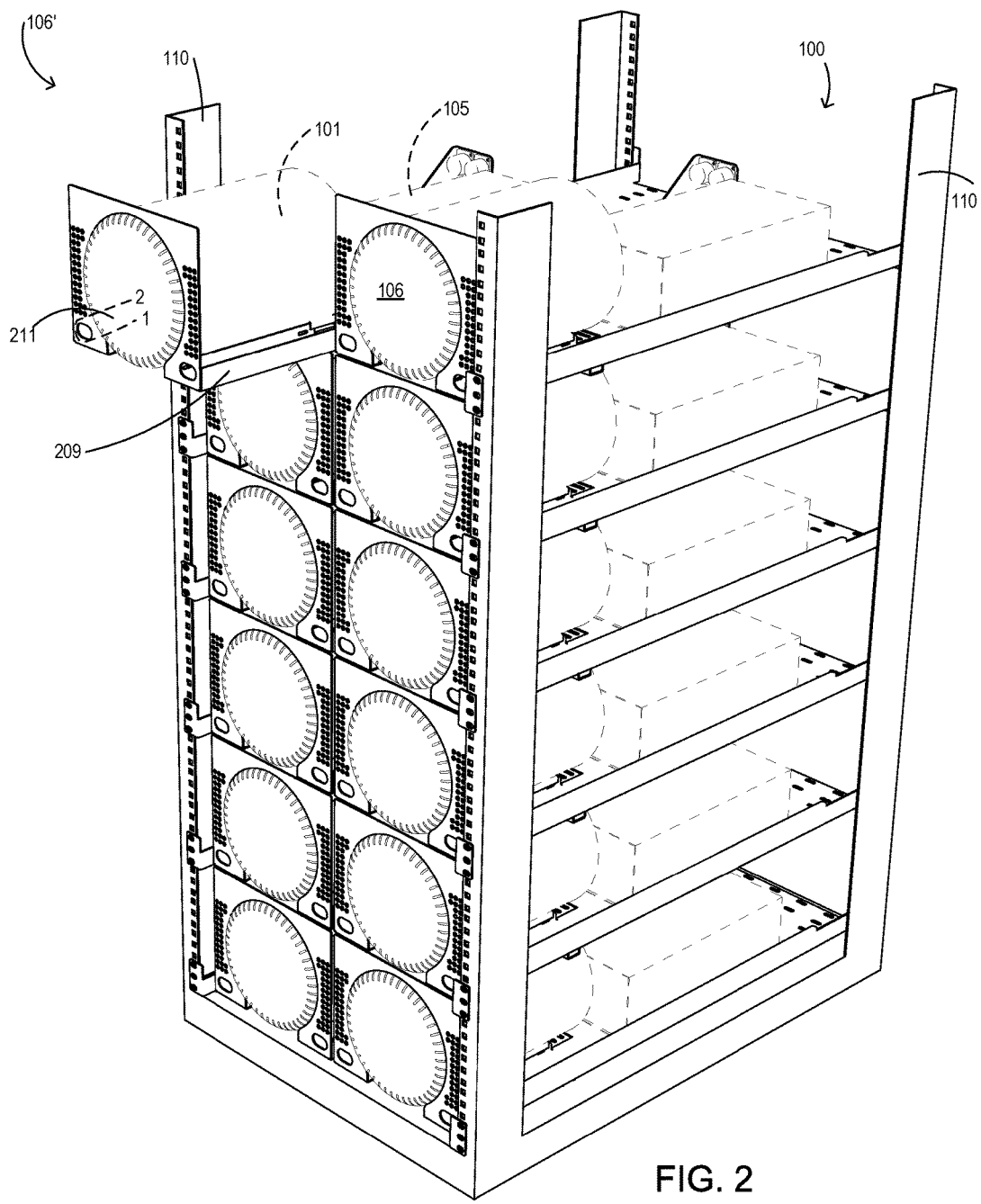
FIG. 2 is a perspective view of the data center mounting rack as shown in FIG. 1 with an upper-leftmost sled pulled in an outward position, according to an aspect of the present disclosure.

FIG. 2 illustrates a rack assembly 100 shown in FIG. 13A, showing a sled 106' in an extended configuration with the computer 101 exposed for access. In this embodiment, the extended sled 106' is assuming an outward position that permits easier maintenance of an enclosed cylindrical form computer 101, networking and power cables, and an accompanying port expansion chassis 105. In various embodiments, a sled right side rail (or rib) 209 is exposed when a sled 106' is moved into an outward, extended position. A corresponding sled left side rail (or rib) 211 (shown in phantom) is provided on the opposite side of the sled 106. In some embodiments, the sled side rails 209, 211 provide support to the structure of the sled 106, and/or may enhance the ability to pull a sled 106 to the outward position, such as sled 106'.

Figure 3:
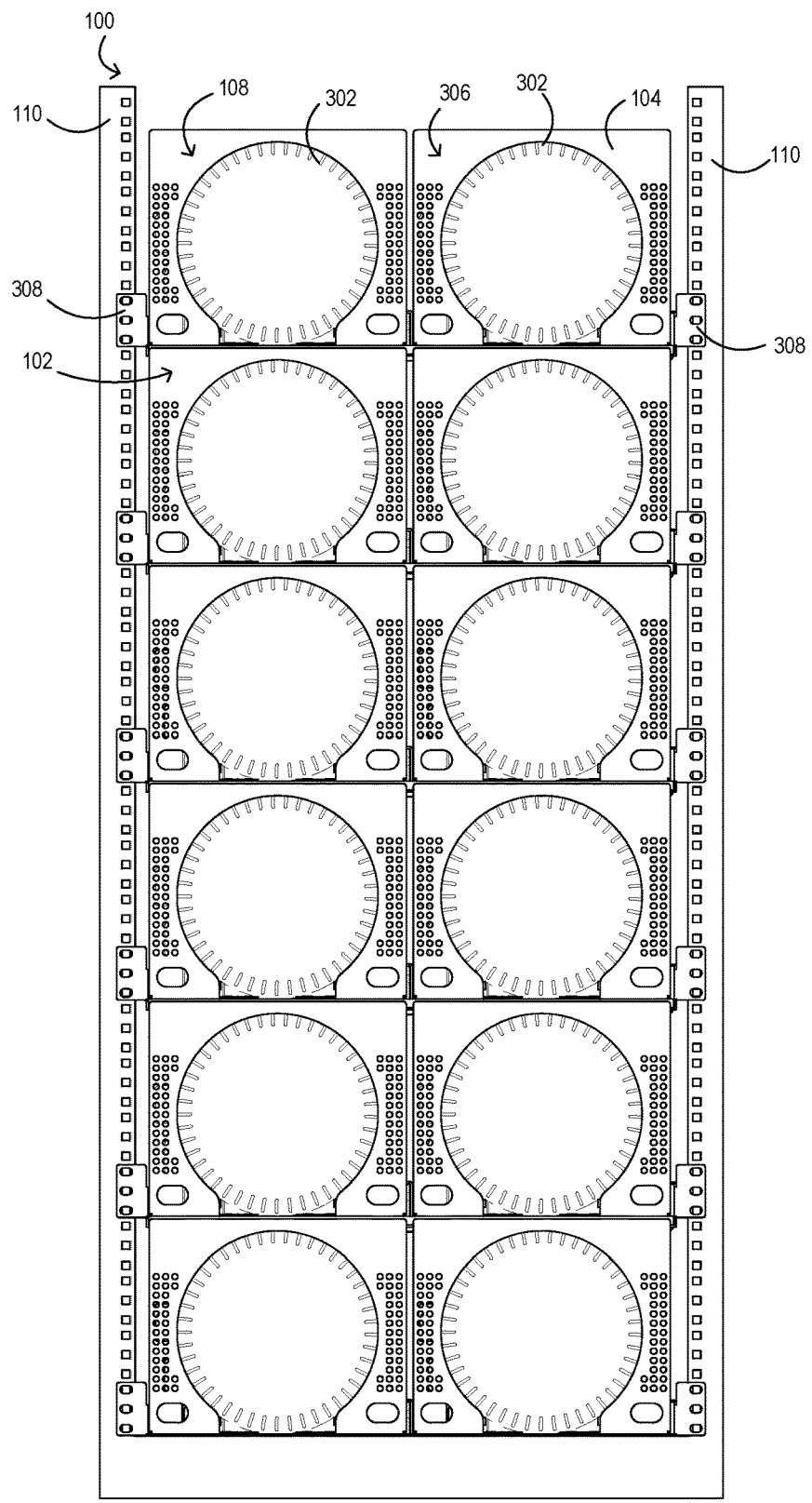
FIG. 3 is a front plan view of the disclosed data center mounting rack.

Turning to FIG. 3, the exemplary assembled data center mounting rack 100, including six shelf assemblies 102 with cylindrical computer 101 and port expansion chassis 105 in phantom, is shown in a front plan view. In one embodiment, the cylindrical form computers 101 housed in the exemplary data center mounting rack 100 are positioned so that one end of a cylindrical form computer 101 may rest adjacent to a mostly-circular opening 302 in a sled face 108. In various embodiments, the radius of the mostly-circular opening 302 is at least slightly smaller than the radius of the cylindrical form computer 101. In one embodiment, this difference in radius between the mostly-circular opening 302 and the cylindrical form computer 101 may allow for the cylindrical form computer 101 to be pushed adjacent to the mostly-circular opening 302 without extending through the opening, for example to facilitate air flow from the top of the computer 101. As will be discussed later, the mostly-circular opening 302 is not fully circular for utility reasons regarding airflow and efficient manufacturing.

Continuing with FIG. 3, in various embodiments, rows of perforated air holes 306 occupy the surface area of the sled face 108 to the left and right of the mostly-circular opening 302. In the present embodiment, thirteen rows of perforated air holes 306 occupy the surface area to the left and right of the mostly-circular opening 302. These rows of perforated air holes 306 promote air flow from inside the exemplary assembled data center mounting rack 100 to the outside environment, which aids in maintaining an appropriate operating temperature for any cylindrical form computers 101 and expansion chassis 105 held therein. In various embodiments, more or fewer perforated air holes 306 than shown in the present embodiment may occupy the surface area of the sled face 108, allowing more or less air flow through the holes in order to meet certain engineering constraints.

Continuing further with FIG. 3, tray securement tabs 308 are provided for at least partially securing the shelf assemblies 102 to the frame 110 of the exemplary assembled data center mounting rack 100. As will be discussed below, the shelf assemblies 102 are at least partially secured to a data center mounting rack frame 110 via the tray securement tabs 308, located at least on both the front and rear sides of each tray 104, according to the present disclosure.

Figure 4:
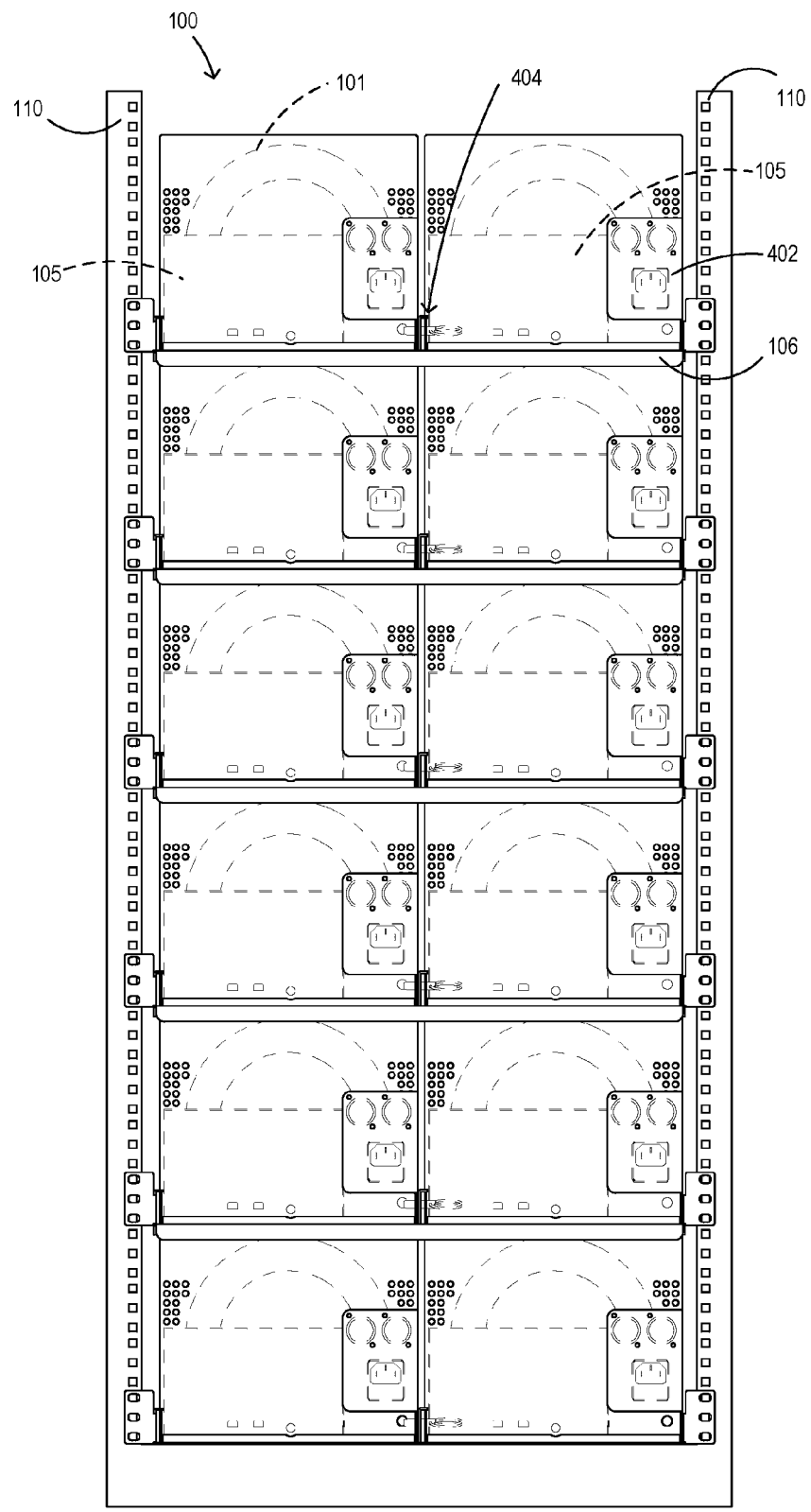
FIG. 4 is a rear plan view of the disclosed data center mounting rack.

FIG. 4 is a rear plan view of the exemplary assembled data center mounting rack 100 in one particular embodiment. According to one aspect, a port connector tab 402 is shown for accommodating the wire and cable ports of an expansion chassis 105 associated with a circular form computer 101. An expansion chassis 105 is typically provided for power and data connections to electronic components housed in the exemplary assembled data center mounting rack 100. In various embodiments, the port connector tab 402 is positioned adjacent to a side rail (not shown) of a sled 106. The port connector tab 402 adjacent to the left side rail of a sled 106 allows for easier handling of wires (e.g., power, networking, etc.) or may simplify the manufacturing process of each sled 106. In some embodiments, two sleds 106 may be secured in an inward position by a pin connector 404. A pair of sleds 106 may be locked in an inward position with a pin connector 404 to hold the sleds 106 stationary to a tray 104 if maintaining the wiring or other hardware on a sled 106. Also, as will be discussed below, locking a plurality of sleds 106 in an inward position with the pin connector 404 ensures that the cylindrical form computers 101 are positioned above air vents that may promote laminar flow of air through the computer rack 100 for cooling purposes.

Figure 5:
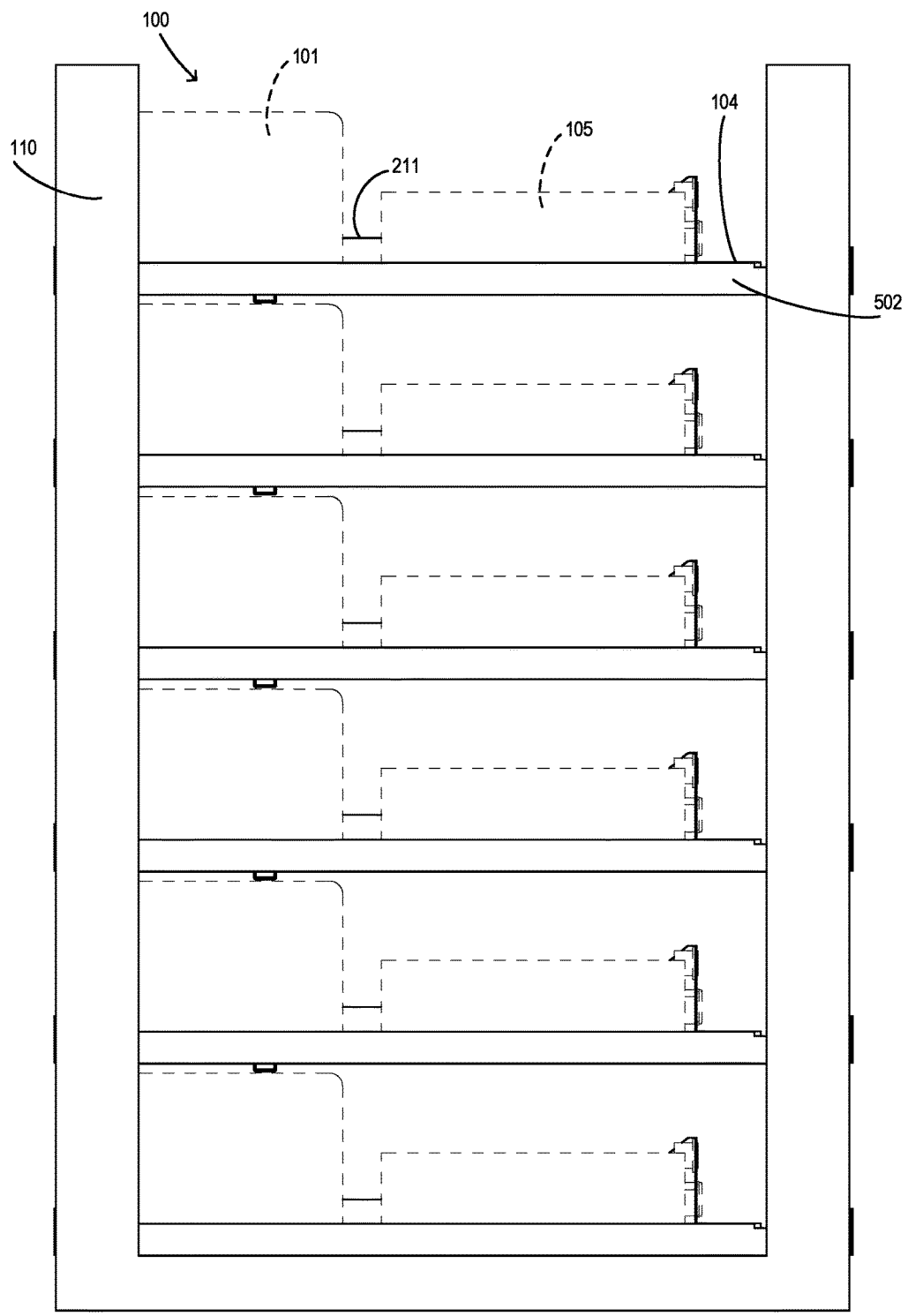
FIG. 5 is a right elevation view of the disclosed data center mounting rack.

FIG. 5 is a right side elevation view of an exemplary assembled data center mounting rack 100. In one embodiment, a tray left side rail (or rib) 211 extends horizontally across from the front to the rear of a tray 104 of exemplary assembled data center mounting rack 100. In various embodiments, a portion of a sled left side rail (or rib) 211 is seen extending upwardly above the highest portion of a tray right side rail 502. As will be discussed more fully below, the sled left side rail 211 is vertically higher than the sled right side rail 209. In the present embodiment, the sled right side rail 209 is positioned behind the tray side rail 502 and is therefore not seen in FIG. 5.

Figure 6:
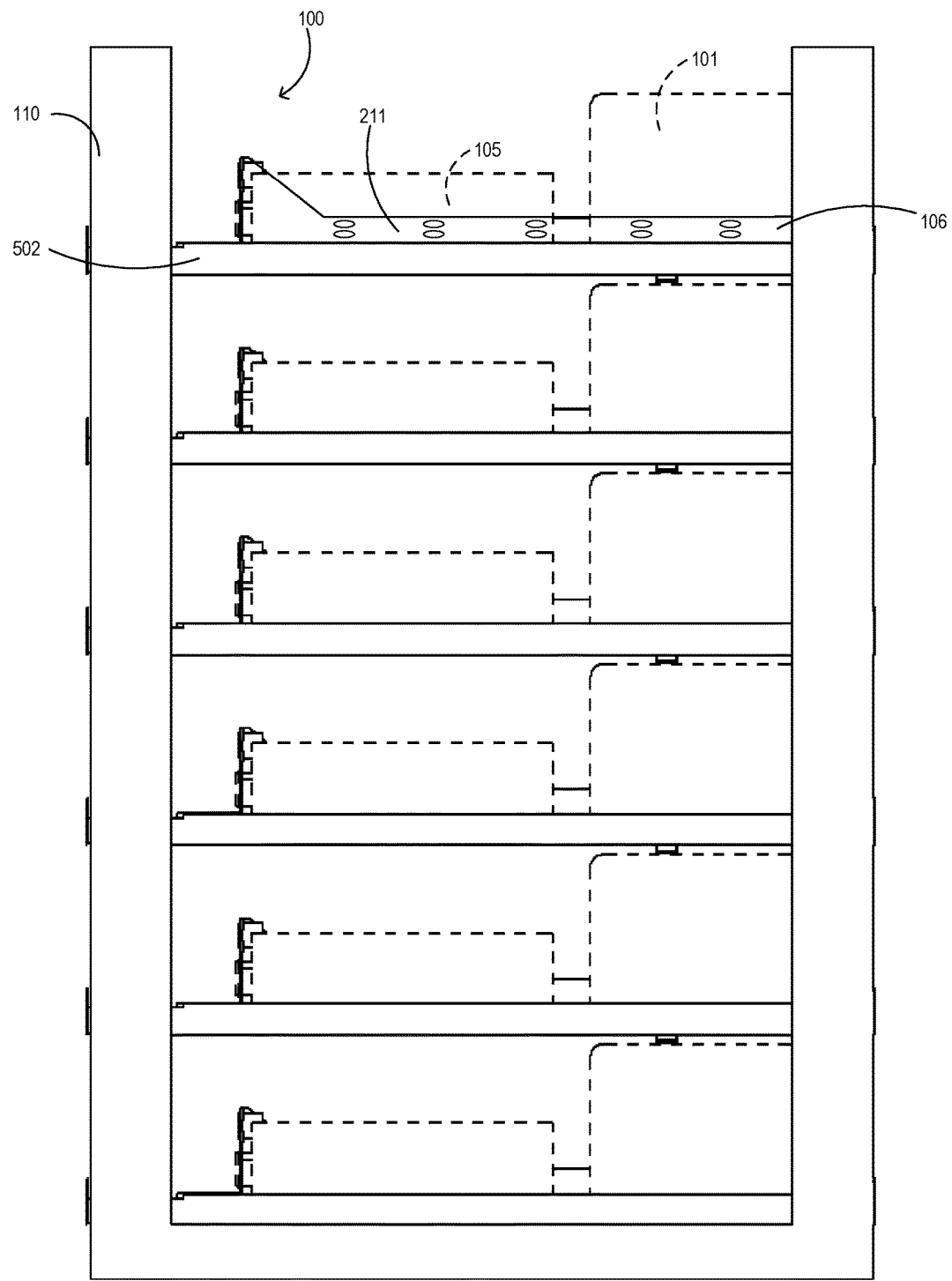
FIG. 6 is a left elevation view of the disclosed data center mounting rack.

FIG. 6 is a left side elevation view of an exemplary assembled data center mounting rack 100. In the embodiment shown, the sled left side rail 211 is shown extending vertically above the highest portion of the tray side rail 502. In various embodiments, the sled left side rail 211 of a sled 106 may extend to about twice the height of the highest portion of the tray side rail 502.

Figure 7:
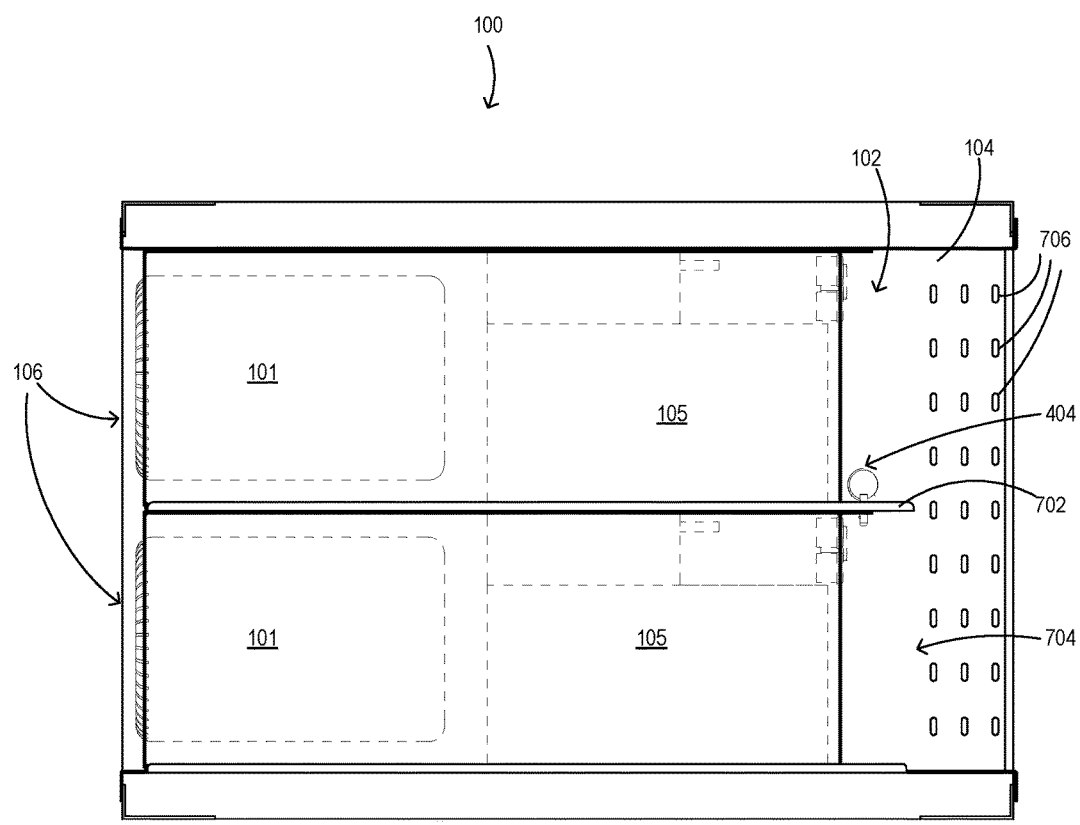
FIG. 7 is a top plan view of the disclosed data center mounting rack.

FIG. 7 is a top plan view of an exemplary assembled shelf assembly 102 of an exemplary data center mounting rack 100, in accordance with the present disclosure. In one embodiment, representations of two cylindrical computers 101 (in phantom) coupled with two port expansion chassis 105 (in phantom) are seen on two sleds 106. According to one aspect, the sleds 106 are secured in an inward position by the pin connector 404. In the embodiment shown, the pin connector 404 secures a sled's left or right side rail, 209 or 211, to a central tray spine (or rib) 702. As will be discussed below, the tray spine 702 is secured to the tray 104 and provides structural support for the tray 104 as well as allow for the sled 106 to be secured by the pin connector 404. In various embodiments, a cable management area 704 is located behind the representation of the port expansion chassis 105. In this particular embodiment, a plurality (27 as shown, in three rows of nine) spaced-apart obround holes 706 are punched in the cable management area 704; however, it should be understood that there could be more or less holes in other embodiments depending on certain utility constraints. In some embodiments, the obround shape of the holes 706 promote laminar flow of cooled air through the shelf assemblies 102. In other embodiments, the size of the obround holes 706 may allow for different types of cables to be threaded through the shelves (e.g., power cables, USB cables, networking cables, etc.) and held in place by cable ties or wraps (not shown).

Figure 8:
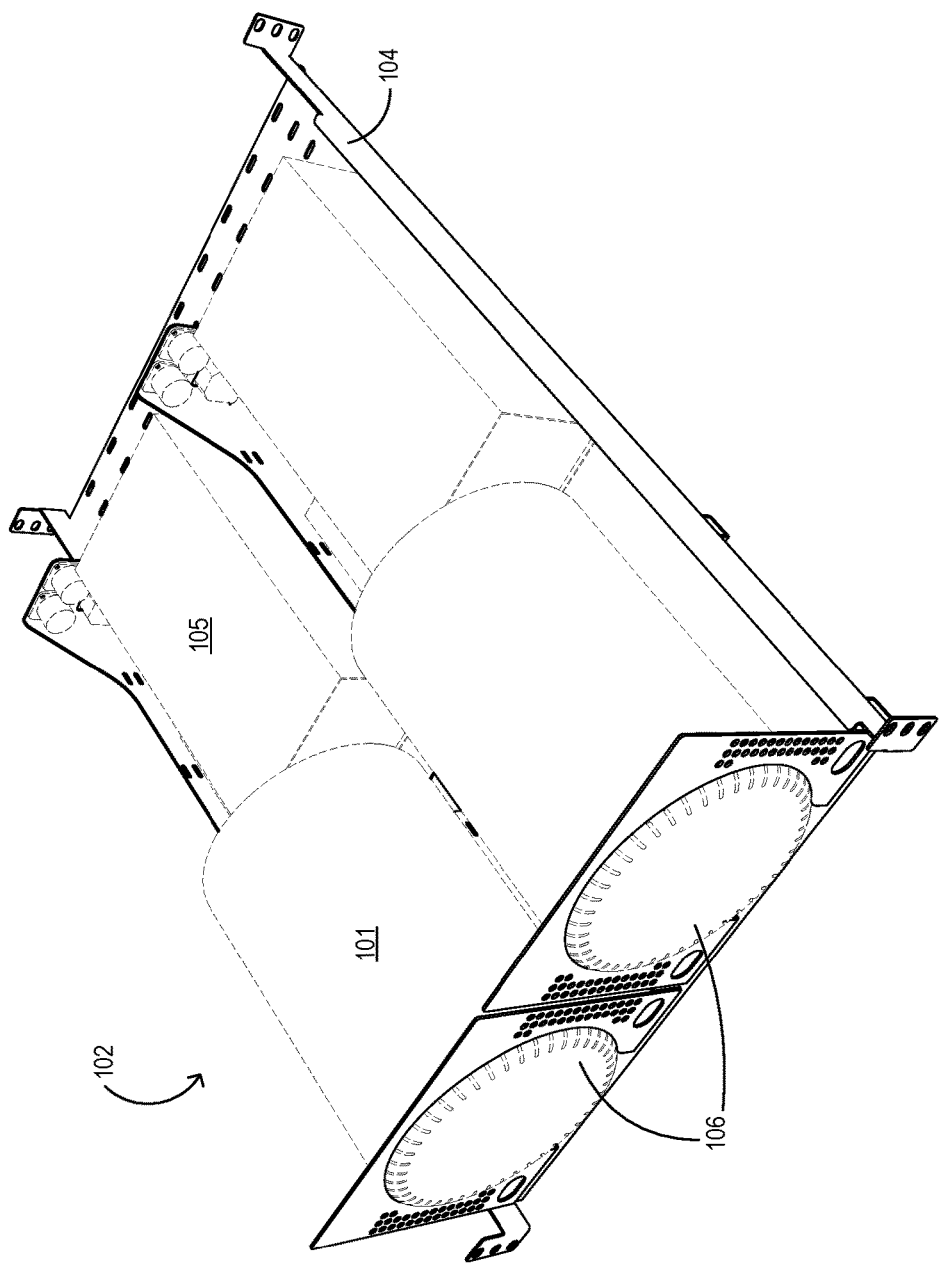
FIG. 8 is a perspective view of a shelf assembly, containing a tray and two sleds.

FIG. 8 is a perspective view of a single shelf assembly 102, in accordance with one aspect of the present disclosure. In one embodiment, a shelf assembly 102 includes at least one tray 104 and at least two sleds 106. In various embodiments, at least one cylindrical form computer 101, coupled with at least one expansion chassis 105, horizontally rests on a sled 106, and each sled 106 rests on a tray 104.

Figure 9:
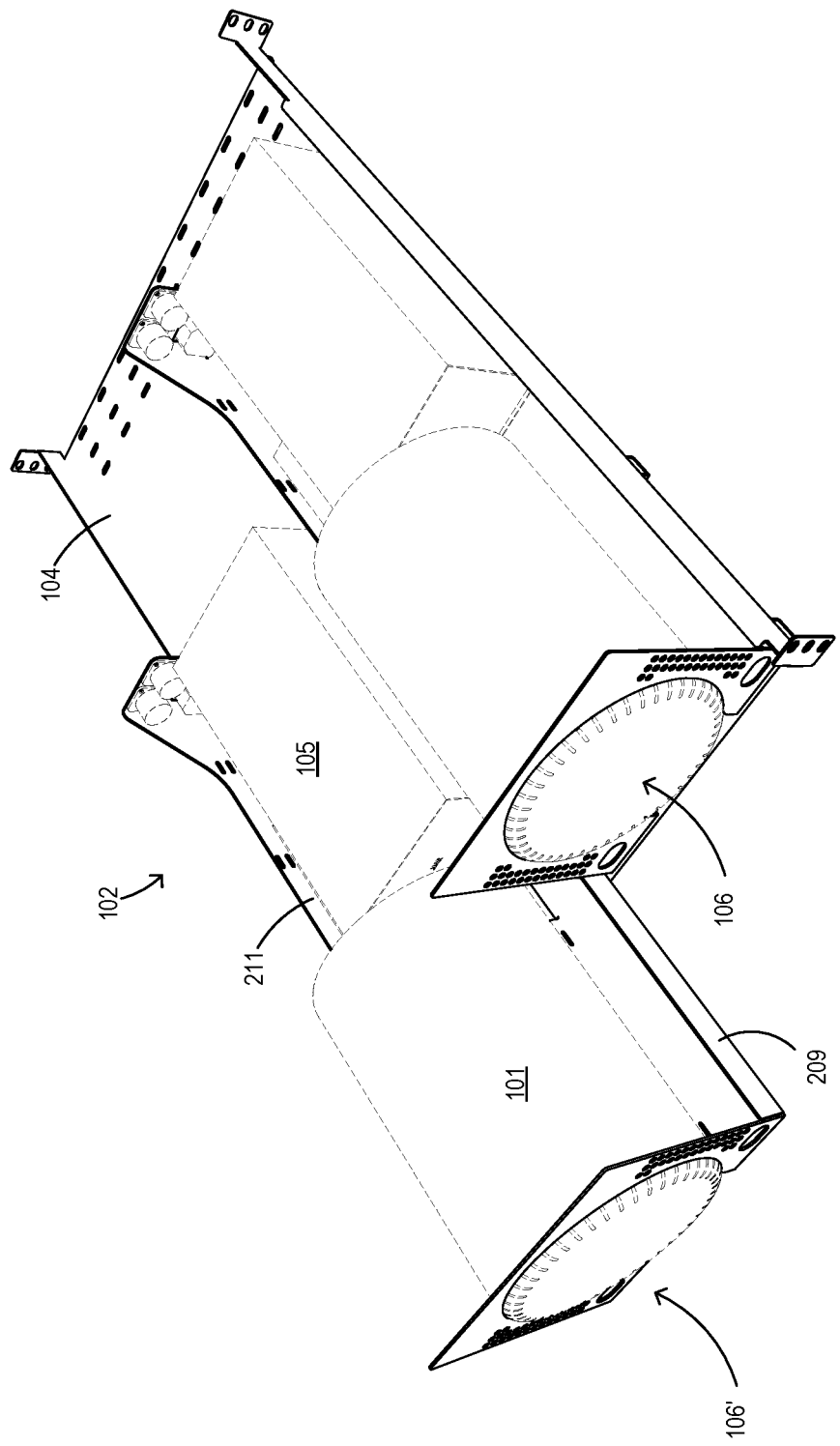
FIG. 9 is a perspective view of the shelf assembly as shown in FIG. 8, with the leftmost sled pulled in an outward position.

FIG. 9 shows an aspect of a shelf assembly 102 substantially similar to that shown in FIG. 8, represented with a sled 106' pulled to an outward, extended position, revealing a rear portion of the tray 104. In the shown configuration, the extended sled 106' oriented in the outward position allows for easier maintenance of an enclosed cylindrical form computer 101, networking and power cables, and port expansion chassis 105. In this view, the sled right side rail 209 is exposed when the sled 106' is oriented in the extended outward position, with the sled left side rail 211 shown on the opposite side. In some embodiments, the sled side rails 209, 211 provide support to the structure of the sled 106, and/or enhance the ability to orient a sled 106 in an outward position like sled 106'.

Figure 10:
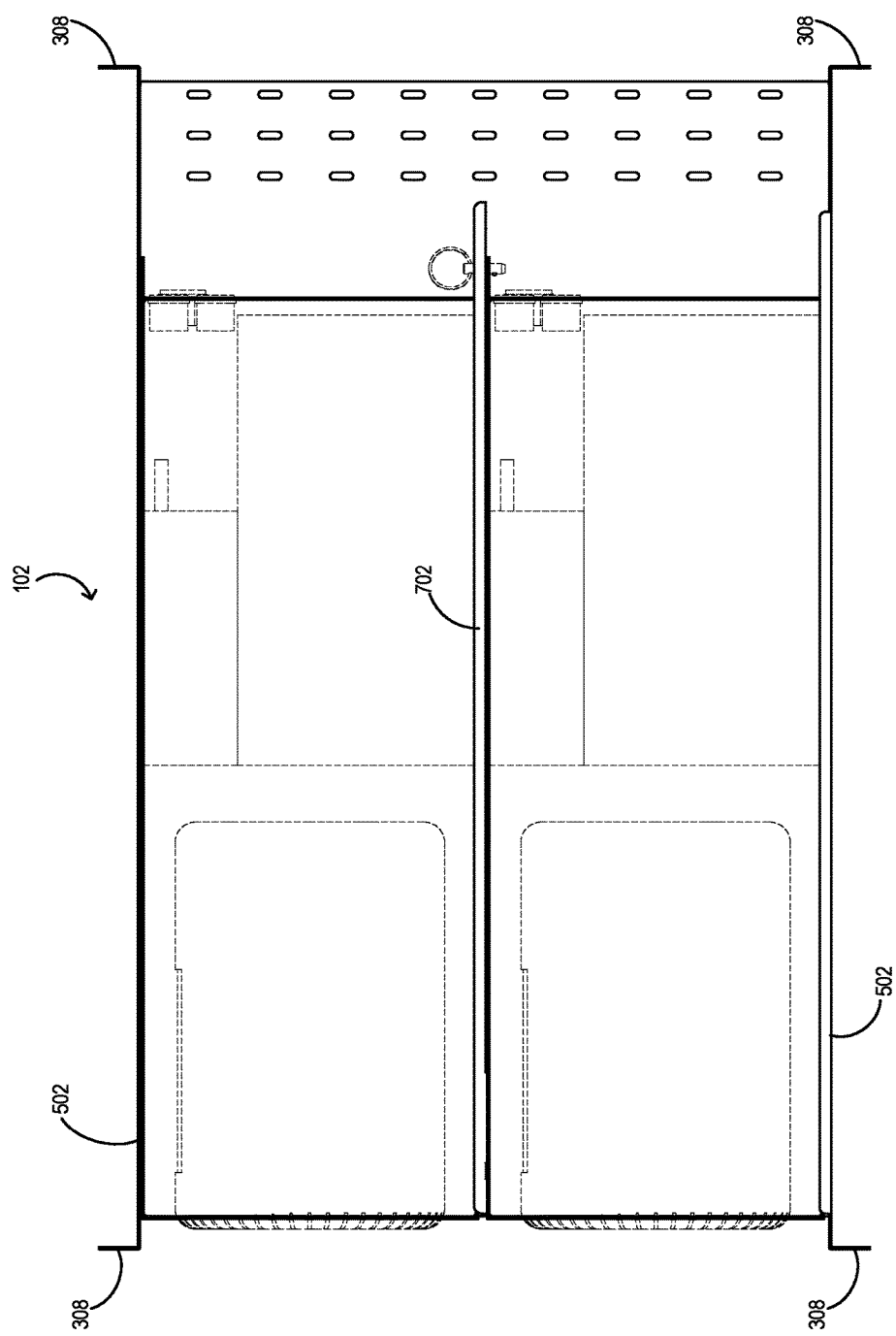
FIG. 10 is a top plan view of a shelf assembly containing a tray and two sleds.

FIG. 10 is a top plan view of shelf assembly 102, in accordance with the present disclosure. In one embodiment, the ends of the tray side rails 502 (front and rear) include an approximately 90 degree bend outward to form tray securement tabs 308. In various embodiments, the tray securement tabs 308 may include holes to allow for a securement instrument (e.g., screw, bolt, clip, etc.) to be positioned though the hole. If installed on a data center mounting rack frame 110, the tray securement tabs 308 may align with substantially similar holes on the data center mounting rack frame 110 (not shown in FIG. 10). In various embodiments, the securement instruments mentioned above may be positioned through both sets of holes on the tray securement tabs 308 and the data center mounting rack frame 110 in order to secure the assembled shelf 102 in one position on the data center mounting rack frame 110.

Figure 11:
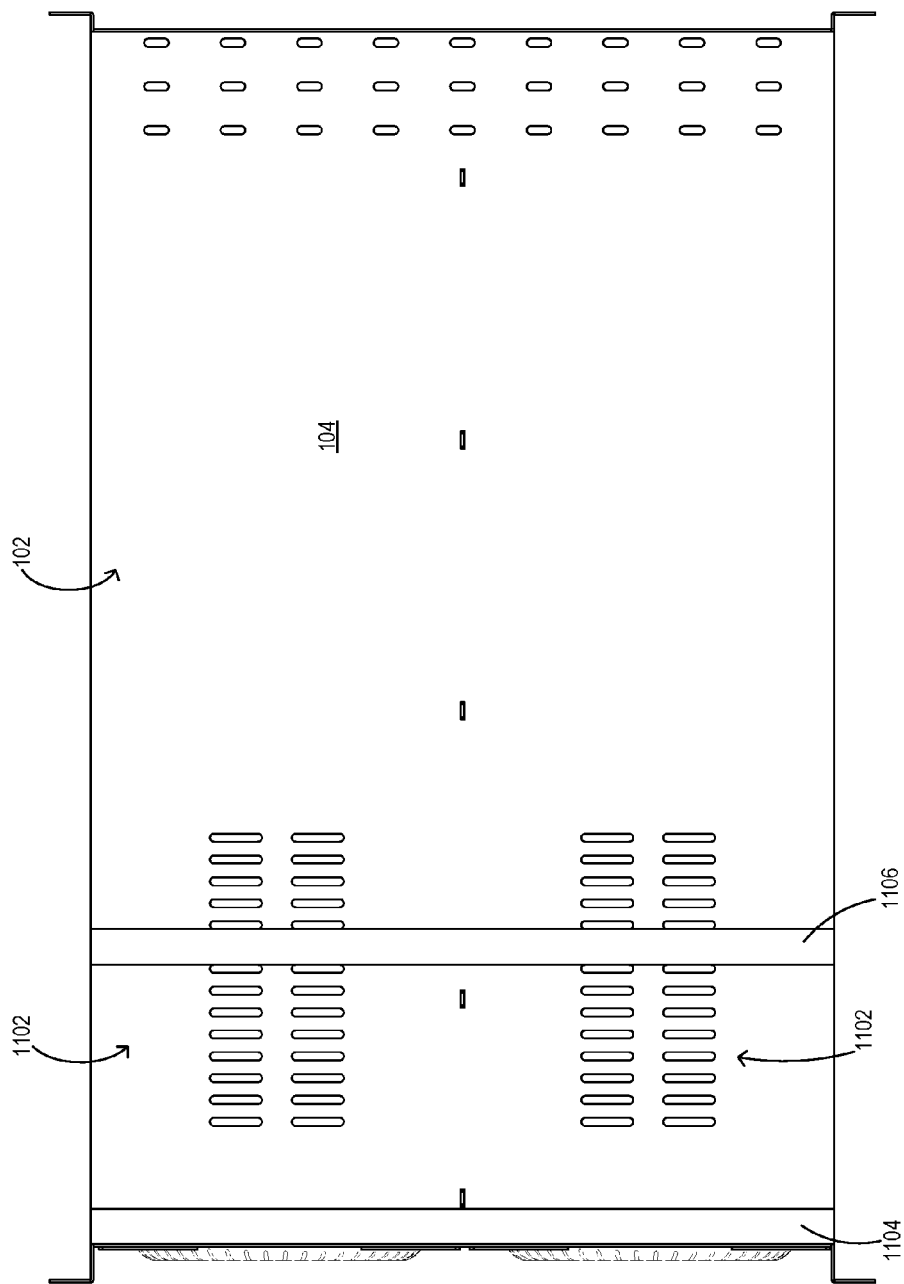
FIG. 11 is a bottom plan view of a shelf assembly.

FIG. 11 is a bottom plan view of an assembled shelf assembly 102, which mainly shows the underside of a tray 104. According to one aspect, two pairs of rows parallel oriented, spaced apart air vents 1102 are seen below where a circular form computer 101 (not visible) may be horizontally positioned on the opposite (upper) side of the tray 104. The air vents 1102 include an elongated obround shape and continue downward for a portion of the length of the tray 104. In one embodiment, the shelf assembly 102 includes two rows of fourteen each (as shown) spaced apart tray air vents 1102 underneath where each circular form computer 101 may be horizontally resting, totaling fifty-six tray air vents in total. The elongated obround shape of the tray air vents 1102 promote air flow through the exemplary data center mounting rack 100 so as to guide heat away from circular form computers 101 and expansion chassis 105 held therein. In various embodiments, the shelf assembly 102 may include more or less than fifty-six total tray air vents 1102 and the shape of the air vents may assume other shapes, not limited to elongated obround, depending on the particular engineering constraints of the application.

Continuing with FIG. 11, two lateral tray support cross bars 1104, 1106 are shown. According to an aspect, the tray support cross bars 1104, 1106 stretch across the width of the tray 104. In various embodiments, one support cross bar 1104 may positioned along a front lip of the tray 104 and the other bar may be positioned underneath the region having spaced apart tray air vents 1102 described above. The tray support cross bars 1104, 1106, in various embodiments, add structural support to the shelf assembly 102 if a substantial amount of the weight from the circular form computers 101 are positioned towards the front of the tray 104.

Figure 12:
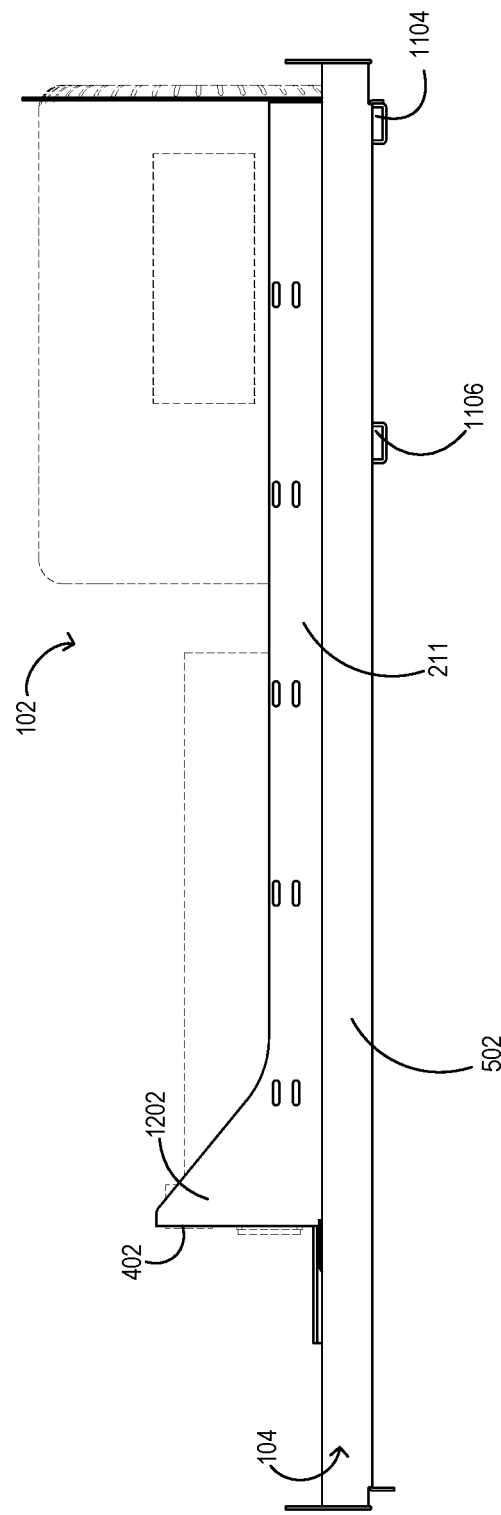
FIG. 12 is a left elevation view of a shelf assembly.

FIG. 12 is a left side elevation view of a shelf assembly 102, in accordance with the present disclosure. In one aspect, the sled left side rail 211 includes a triangular tab 1202 at the end portion of the sled left side rail 211. In this particular aspect, the triangular tab 1202 linearly increases in vertical height until it reaches its largest vertical height at the end portion of the sled left side rail 211. This linear increase in vertical height of the triangular tab 1202 allows for increased surface area at the end portion of the sled left side rail 211. In other embodiments, the triangular tab 1202 may increase in other ways that are not linear (e.g., exponential, stepwise, etc.). According to one aspect, the end portion of the sled left side rail 211 is bent to form a port connector tab 402. The sled left side rail 211 extends above the height of the tray side rail 211 of the tray 104.

Continuing with FIG. 12, the end profiles of the tray support cross bars 1104, 1106 are shown in accordance with one embodiment of the present disclosure. In various embodiments, the tray support cross bars 1104, 1106 may be rectangular shaped and spaced apart. The shape and spacing of the tray support cross bars 1104, 1106 may increase the effectiveness of the cross bars in supporting the contents of the exemplary assembled shelf assembly 102.

Figure 13:
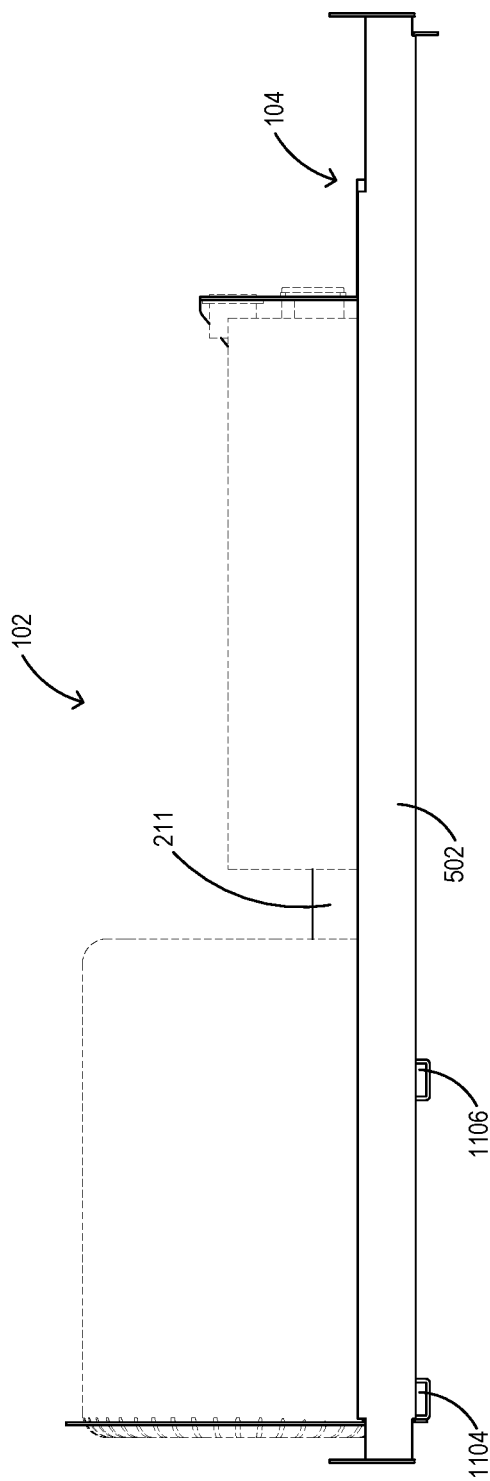
FIG. 13 is a right elevation view of a shelf assembly.

FIG. 13 is a right side elevation view of a shelf assembly 102. As can be seen, the sled left side rail 211 is visible and extends above the height of the tray side rail 502 of the tray 104.

Figure 14:
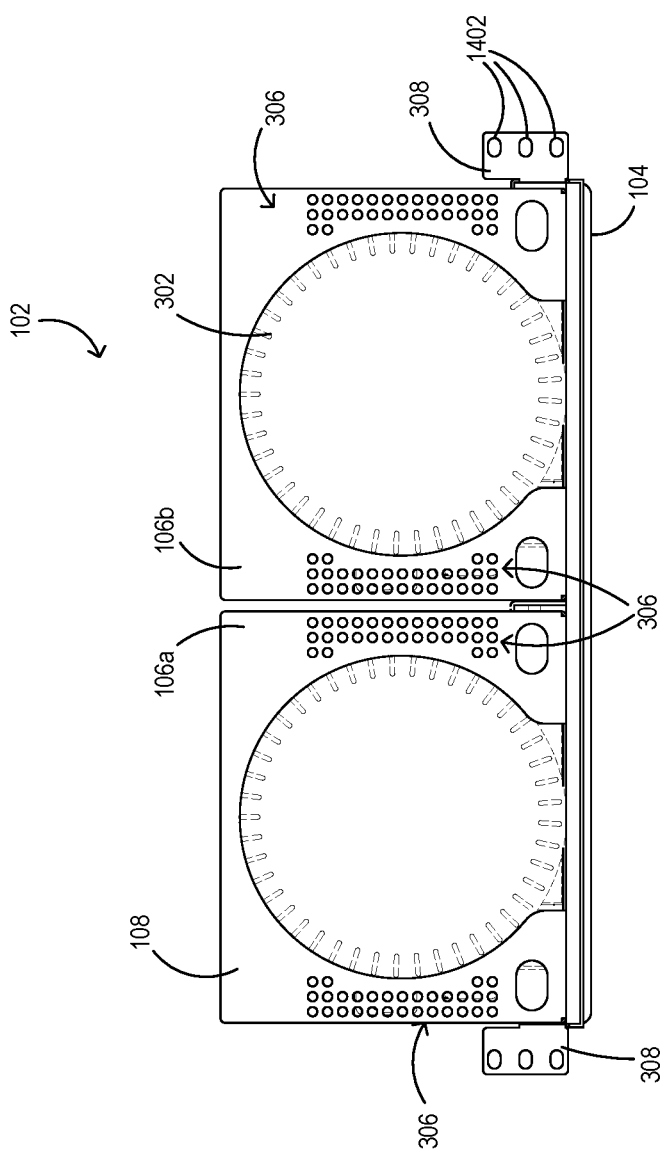
FIG. 14 is a front plan view of a shelf assembly.

FIG. 14 is a front plan view of a shelf assembly 102, according to an aspect of the present disclosure. In one embodiment, the shelf assembly 102 includes at least two sleds 106a, 106b on a tray 104. In the embodiment shown, perforated air holes 306 are positioned along the left and right sides of the sled face 108. In various embodiments, the perforated air holes 306 at least partially surround the shape of mostly-circular opening 302 in the sled face 108. In the embodiment shown, the top two and bottom two rows of perforated air holes 306 include one more hole than the nine other intermediate rows. The additional holes included in the upper and lower two rows occupy the vacant surface area on the sled face 108 resulting from the shape of the mostly-circular opening 302. In some embodiments, the perforated air holes 306 allow for air to flow from inside the space defined by the sled 106 out into the external environment. In other embodiments, there may be more or fewer perforated holes 306 than shown, depending on the size of the perforated holes, the amount of available surface area, and other airflow and/or cooling design constraints.

Still referring to FIG. 14, the tray securement tabs 308 and tray securement tab holes are shown. According to an aspect, the tray securement tabs 308 are a rectangular shape and are oriented vertically. The tray securement tabs 308 may include different shapes and orientations in order to better align with a data center mounting rack frame 110 (not shown). In some embodiments, the tray securement tabs 308 include three tray securement tab holes 1402 for securement instruments (fasteners) to be positioned through. However, it should be understood that in other embodiments the tray securement tabs 308 may include more or fewer tray securement tab holes 1402, as appropriate for that particular embodiment.

Figure 15:
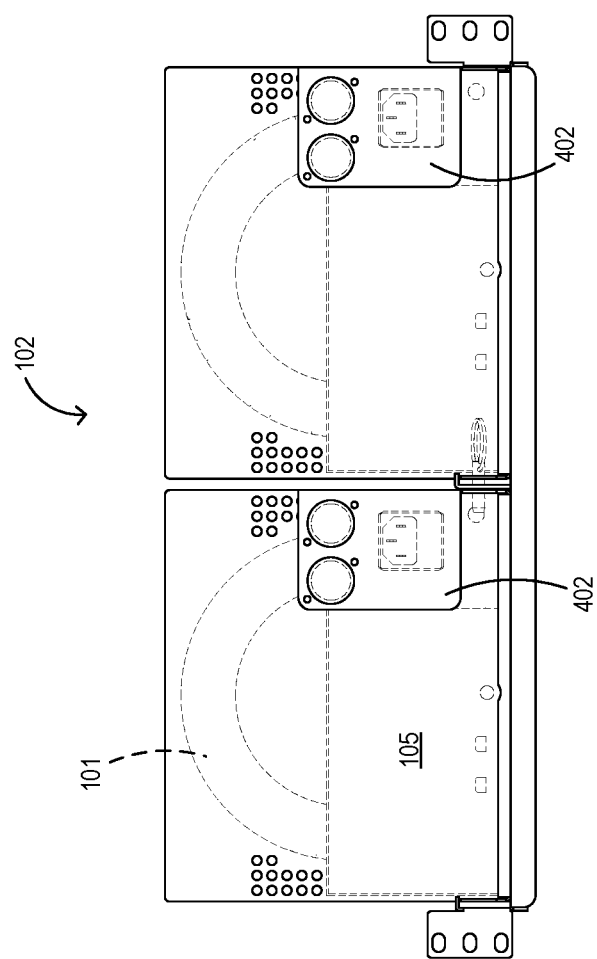
FIG. 15 is a rear plan view of a shelf assembly.

FIG. 15 is a rear plan view of a single shelf assembly 102, according to an aspect of the disclosure. As mentioned above, in various embodiments, the sled left side rail 211 of each sled 106 bends inward at an approximately 90 degree angle to form a port connector tab 402. The bent portion of the sled left side rail 211 is of a sufficient size to include at least the port connectors to an expansion chassis 105 and a cylindrical form computer 101. In other embodiments, a more substantially sized portion of the sled left side rail 211 may be bent in order to allow for more port sockets to reside on the port connector tab 402.

Figure 16:
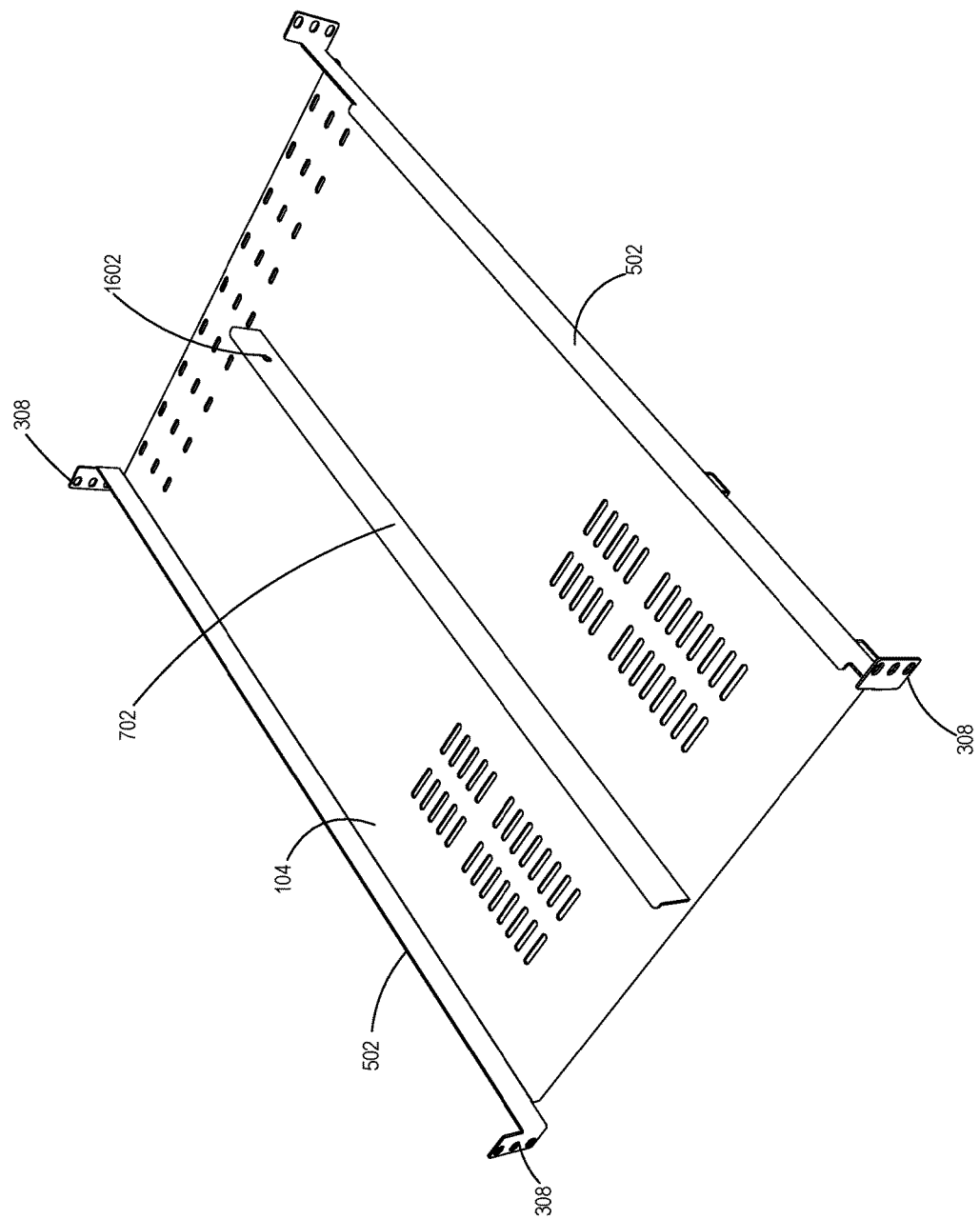
FIG. 16 is a perspective view of a tray, according to an aspect of the present disclosure.

FIG. 16 is a perspective view of a single tray 104, according to one embodiment of the present disclosure. According to one aspect, the tray 104 includes a flat surface, separated into at least two sections by a central tray spine 702 that extends the length of the tray. The tray spine 702 is secured to and extends vertically from the base of the tray 104. In various embodiments, the tray spine 702 includes a pin connector hole 1602. In one embodiment, the pin connector hole 1602 is large enough in diameter to accept a pin connector 404 (not shown). In some embodiments, the pin connector hole 1602 coupled with the pin connector 404 secures a pair of sleds 106 to a tray spine 702, in position on a tray 104.

Figure 17:
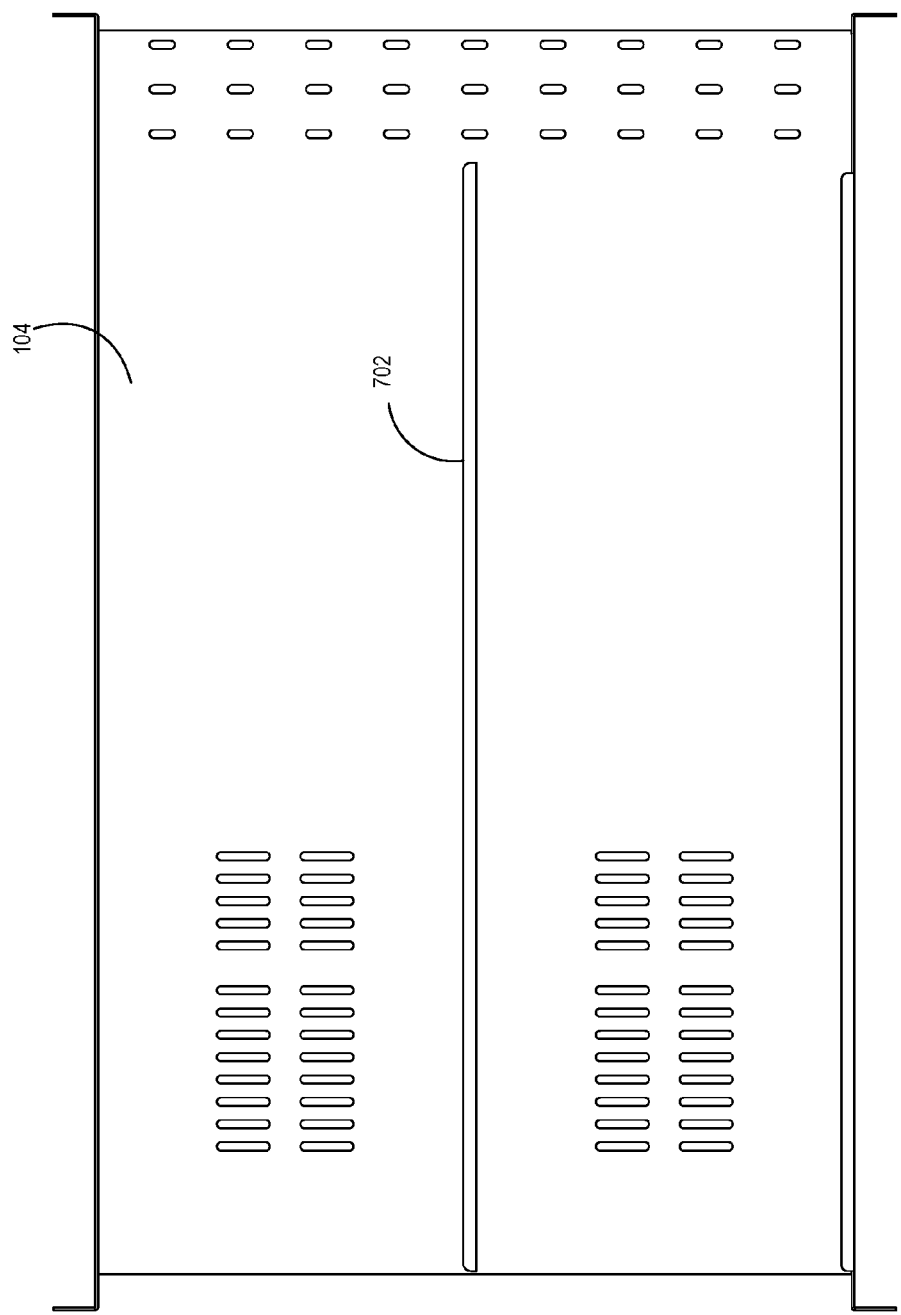
FIG. 17 is a top plan view of a tray.

FIG. 17 is a top plan view of a single tray 104, according to one aspect of the present disclosure.

Figure 18:
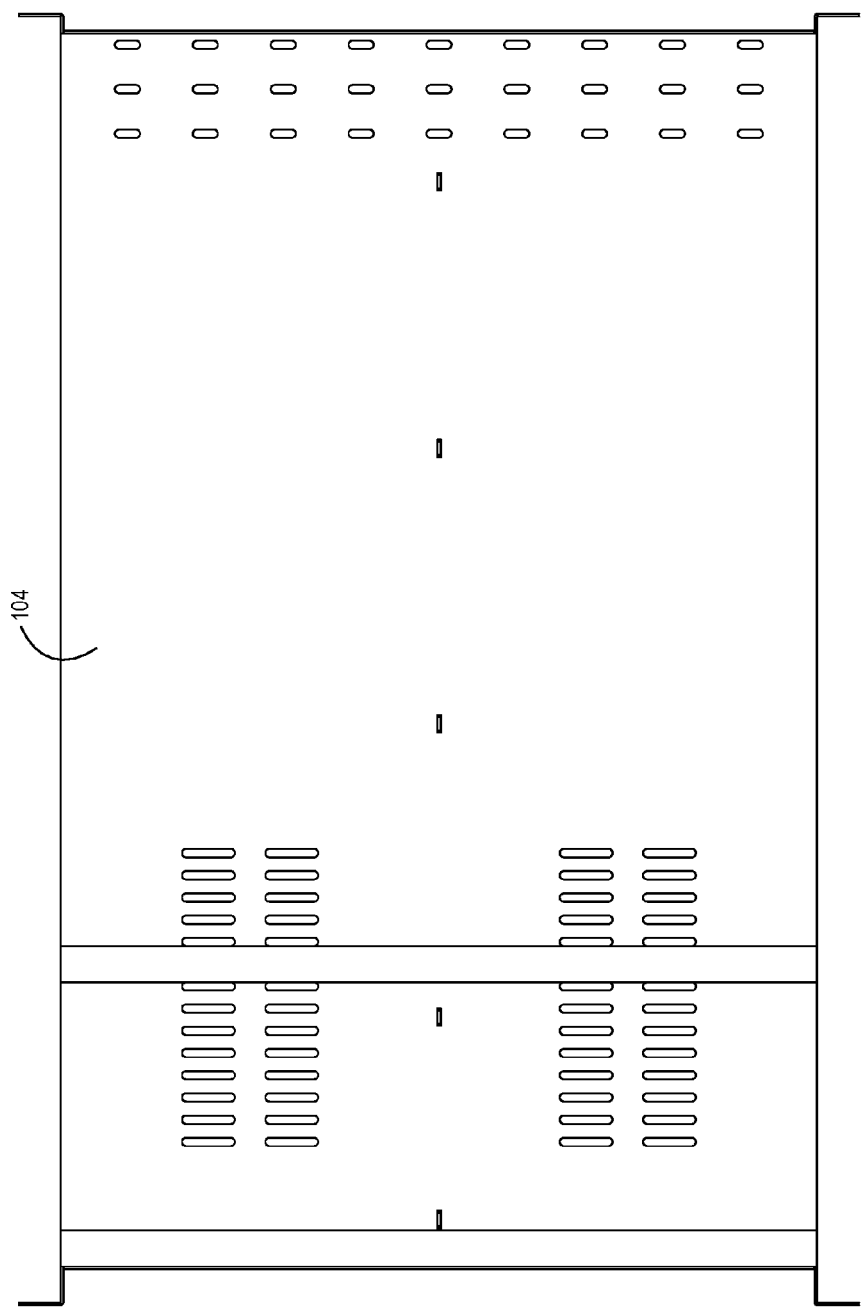
FIG. 18 is a bottom plan view of a tray.

FIG. 18 is a bottom plan view of a tray 104, in accordance with one aspect of the present disclosure.

Figure 19:
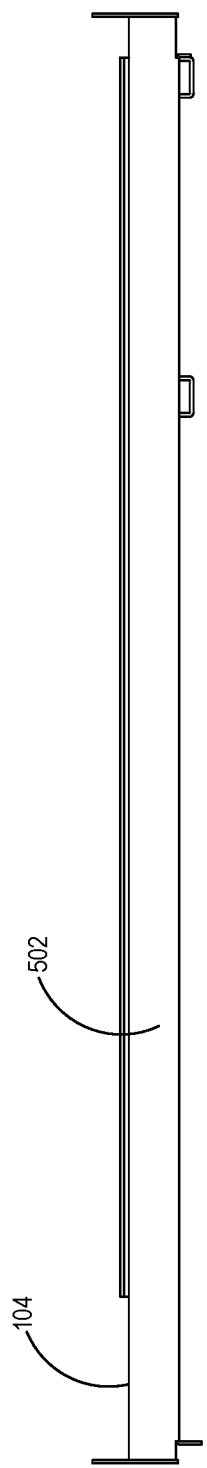
FIG. 19 is a left elevation view of a tray.
Figure 20:
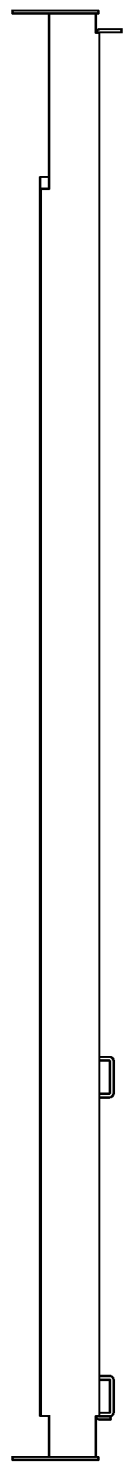
FIG. 20 is a right elevation view of a tray.

FIGS. 19 and 20 are side elevation views of a tray 104, in accordance with one aspect of the present disclosure.

Figure 21:
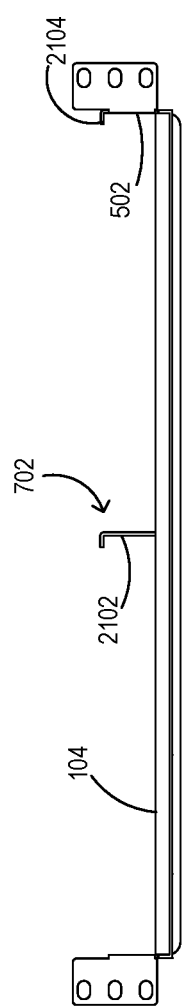
FIG. 21 is a front plan view of a tray.

FIG. 21 is a front plan view of a tray 104, in accordance with one aspect of the present disclosure. In various embodiments, the tray spine 702 and at least one tray side rail 502 include a sled securement lip 2102, 2104, respectively. A sled securement lip 2102, 2104 may be a bend at the upper most portion of a tray spine 702 or at the upper most portion of a tray side rail 502. In some embodiments, sled securement lips 2102, 2104 may prevent a sled 106 from being vertically removed or limit a sled 106 to a horizontal sliding motion. In other embodiments, the sled securement lips 2102, 2104 guide the sled 106 if maneuvered in or out of the tray 104.

Figure 22:
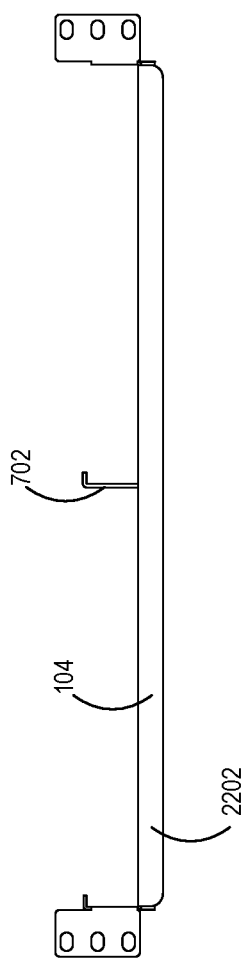
FIG. 22 is a rear plan view of a tray.

FIG. 22 is a rear plan view of a tray 104, in accordance with one aspect of the present disclosure. In various embodiments, a tray 104 includes a rear tray lip 2202. A rear tray lip 2202 may be a downward bent portion of the tray 104. In one embodiment, a rear tray lip 2202 may include rounded edges and allow for cables (e.g., networking, data, power, etc.) to hang over the lip without getting caught on a sharp or jagged edge.

Figure 23:
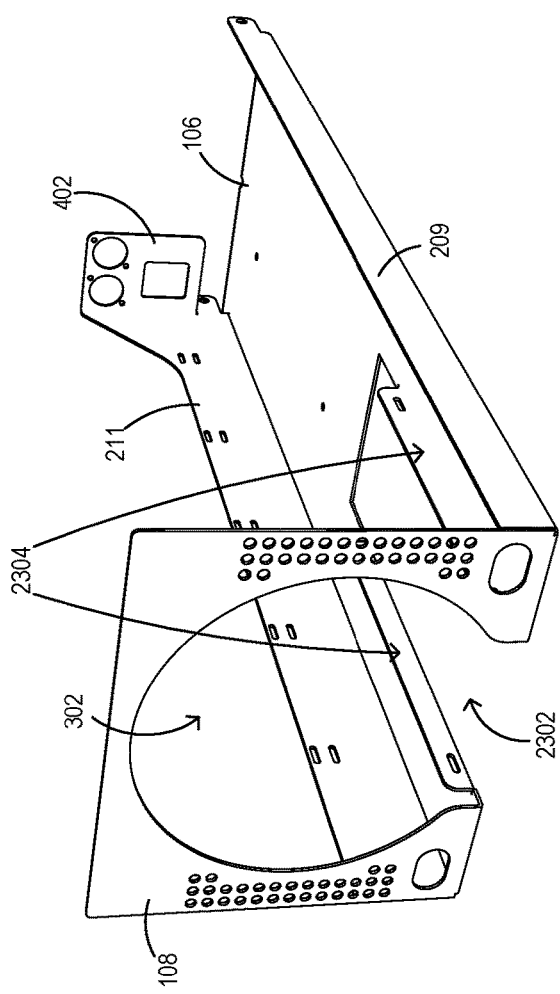
FIG. 23 is a perspective view of a sled, according to an aspect of the present disclosure.

FIG. 23 is a perspective view of a single slidable sled 106, in one particular embodiment. In various embodiments, the base or bottom surface of the sled 106 includes a rectangular opening 2302 above which a circular form computer 101 (not shown) would rest in a horizontal orientation. In one embodiment, extending upwardly from at least one of the sides of the rectangular opening 2302 are a pair of circular form computer mounting rails 2304. In some embodiments, a circular form computer 101 rests horizontally on the mounting rails 2304, thereby securing and supporting a circular form computer 101 and preventing it from moving in a sled 106. As alluded to earlier, the mostly-circular opening 302 is not fully-circular at least partially due to the rectangular opening 2302. In various embodiments, the bottom portion of the mostly-circular opening 302 may be removed to allow for easier manufacturing and also for allowing for increased air flow out of the sled face 108.

The port connector tab 402 and its associated port connector openings are seen as formed from a bent portion of the sled left side rail 211. The sled left side rail 209 is seen as not extending vertically as high as the sled left side rail 211.

Figure 24:
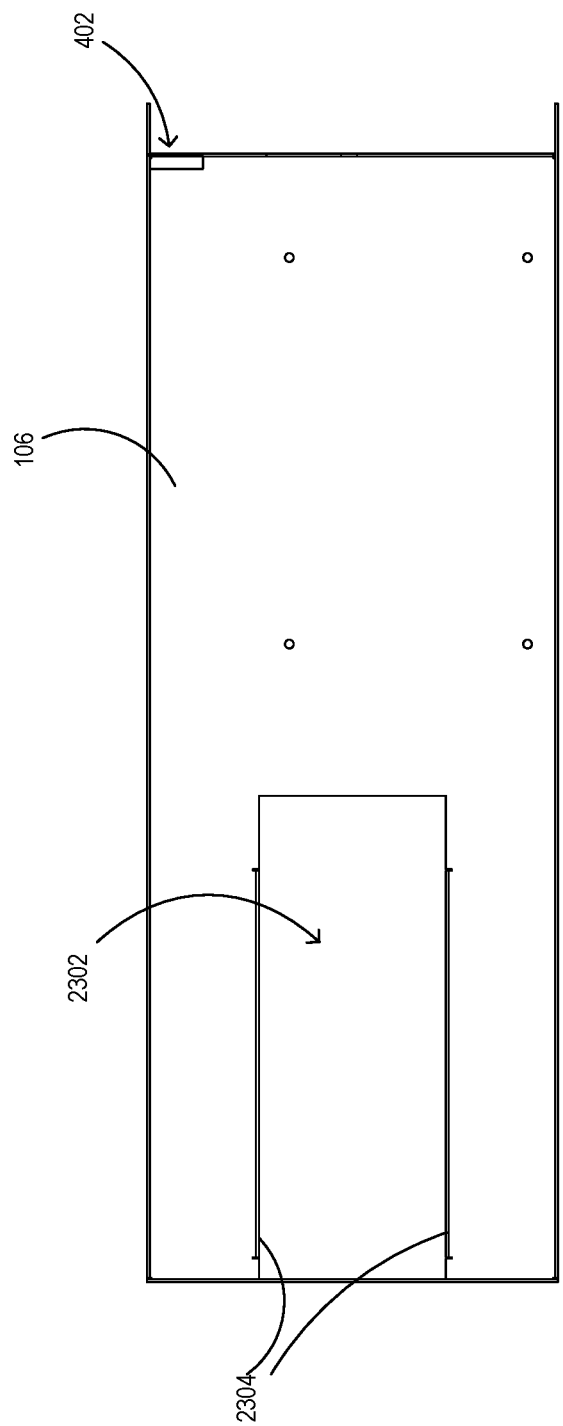
FIG. 24 is a top plan view of a sled.

FIG. 24 shows a top plan view of a sled 106, according to one aspect of the present disclosure.

Figure 25:
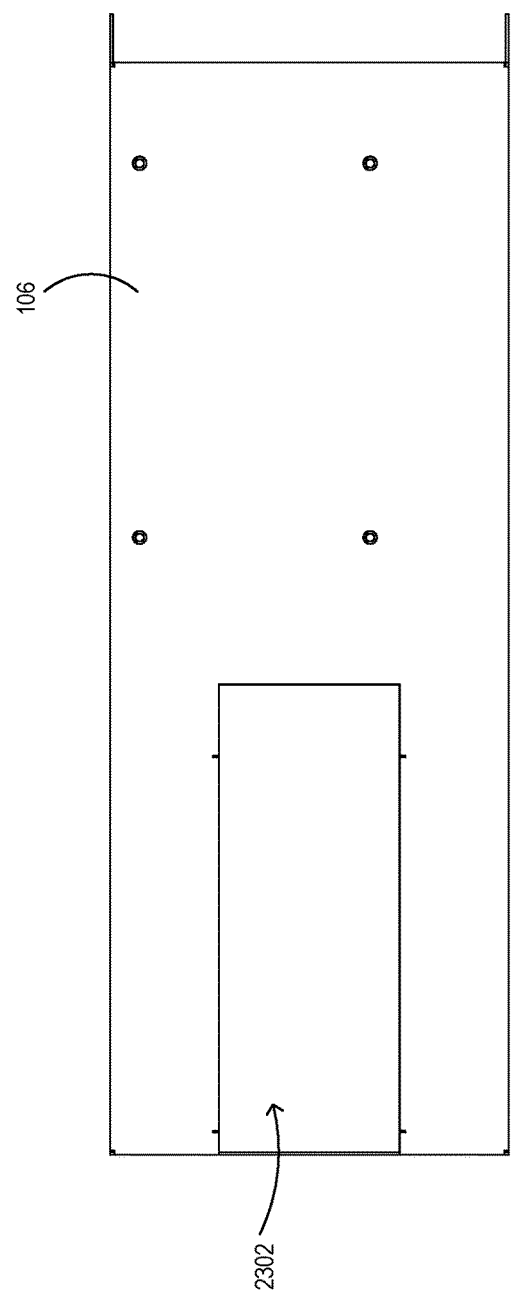
FIG. 25 is a bottom plan view of a sled.

FIG. 25 shows a bottom plan view of a sled 106, according to one aspect of the present disclosure.

Figure 26:
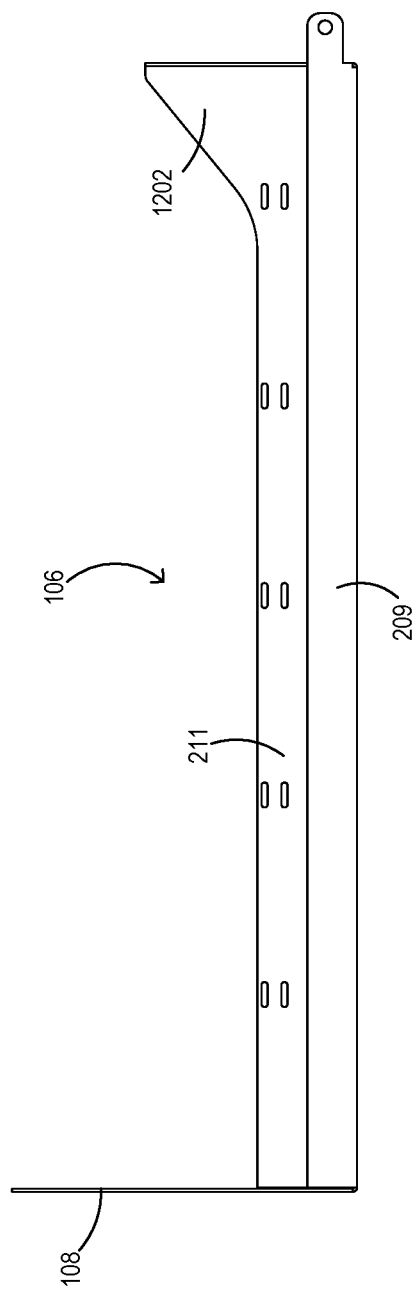
FIG. 26 is a right elevation view of a sled.

FIG. 26 shows a right elevation view of a sled 106, according to one aspect of the present disclosure.

Figure 27:
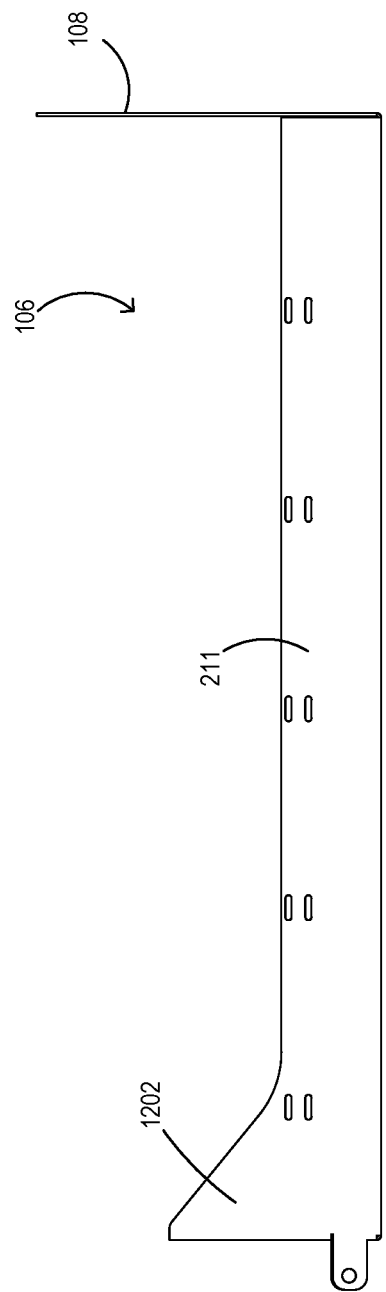
FIG. 27 is a left elevation view of a sled.
Figure 28:
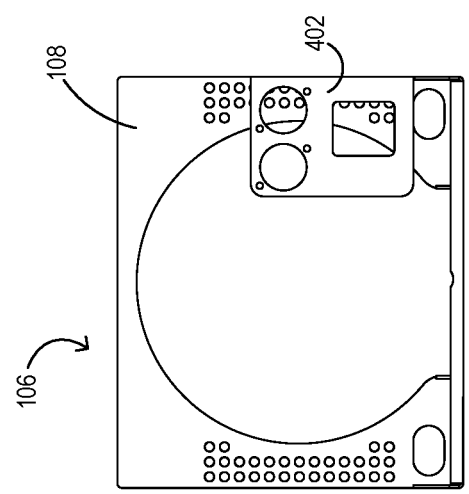
FIG. 28 is a rear plan view of a sled.

FIG. 27 shows a left elevation view of a sled 106, according to one aspect of the present disclosure, FIG. 28 shows a rear plan view of a sled 106, according to one aspect of the present disclosure.

Figure 29:
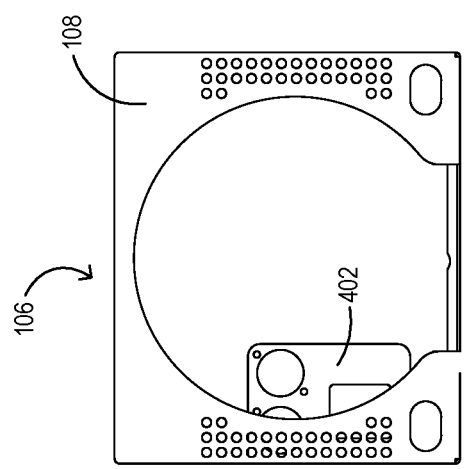
FIG. 29 is a front plan view of a sled.

FIG. 29 shows a front plan view of a sled 106, according to one aspect of the present disclosure.

From the foregoing, it will be understood that the spacing of the cylindrical form enclosures, dimensions and spacing of the staggered openings for air flow in between the cylindrical form enclosures, spacing of the shelves relative to each other, openings in side panels for cabling of communications and power, slide-in mounting arrangement, side-panel mounting for power and telecommunications components, front and rear accessibility for dual side mounting of computers, all contribute to a novel and nonobvious arrangement for cylindrical form data center computers such as Mac Pros, in a highly optimal configuration to include as many computers as possible given a floor footprint, cabling access and routing, and cooling air flow capability to maintain the array within specified operating temperatures in the data center.

The foregoing description of the exemplary embodiments has been presented only for the purposes of illustration and description and is not intended to be exhaustive or to limit the inventions to the precise forms disclosed. Many modifications and variations are possible in light of the above teaching.

The embodiments were chosen and described in order to explain the principles of the inventions and their practical application so as to enable others skilled in the art to utilize the inventions and various embodiments and with various modifications as are suited to the particular use contemplated. Alternative embodiments will become apparent to those skilled in the art to which the present inventions pertain without departing from their spirit and scope. Accordingly, the scope of the present inventions is defined by the appended claims rather than the foregoing description and the exemplary embodiments described therein.

What is claimed is:

1. A data center mounting rack for mounting and supporting a plurality of special physical form computer enclosures and port expansion chassises in a stacked arrangement, comprising:
   a shelving arrangement comprising a plurality of spaced apart vertical end supports supporting a plurality of horizontal mounting trays, each of the horizontal mounting trays supporting at least a pair of computer enclosures;
   each of the horizontal mounting trays including one or more rows of first openings positioned at a proximal end of each horizontal mounting tray for permitting cooling air flow in a vertical direction, said first openings positioned in a pair of spaced apart computer enclosure mounting regions positioned immediately below one of said computer enclosures when mounted above the first openings;
   each of the horizontal mounting trays including one or more rows of second openings positioned at a distal end of each horizontal mounting tray for allowing the passage therethrough of cabling for computer enclosures when mounted to each said horizontal mounting tray and for permitting cooling air flow in a vertical direction;
   a central supporting rib extending along the length of each horizontal mounting tray, dividing the spaced apart computer enclosure mounting regions;
   a pair of elongate mounting edge ribs extending along each outer edge of each horizontal mounting tray;
   attachment surfaces affixed to each elongate mounting edge rib, for attaching each horizontal mounting tray to the vertical end supports;
   at least one slidably-removable horizontal sled for supporting one of said computer enclosures in a slidable arrangement relative to a horizontal mounting tray, each horizontal sled capable of assuming a closed position for operation and an open position positioned outwardly of the proximal end of said horizontal mounting tray to allow access to a supported computer enclosure and/or port expansion chassis mounted to the horizontal sled;
   each horizontal sled comprising a generally planar lower surface, a vertically extending sled face at a proximal end that includes an opening for exposing a portion of a supported computer enclosure, a pair of elongate edge ribs extending along the length of each horizontal sled, with a first elongate edge rib including a port connector tab for supporting electrical connectors of one of said port expansion chassises mounted to a horizontal sled; and
   each horizontal sled further including a pair of support rails positioned in a central region of the horizontal sled, for supporting one of said computer enclosures and for defining an opening in the horizontal sled that is positioned immediately above the first openings of one of the computer enclosure mounting regions of a horizontal mounting tray when a horizontal sled is in the closed position, for facilitating the flow of air through the first openings and around a supported computer enclosure mounted to the horizontal sled.

2. The data center mounting rack of claim 1, wherein the special physical form computer enclosures are cylindrical form computer systems.

3. The data center mounting rack of claim 2, wherein the cylindrical form computer systems are Apple® Mac Pro® brand of cylindrical form computers.

4. The data center mounting rack of claim 2, wherein each computer enclosure is mounted to a horizontal sled with the central axis of said computer enclosure in a horizontal orientation.

5. The data center mounting rack of claim 1, wherein the sled face includes plurality of perforated air holes positioned on either side of the opening for allowing the entry of cooling air into a space behind the sled face and directed across a surface of a computer enclosure supported on said horizontal sled.

* * * * *